(12) United States Patent
Sugaya et al.

(10) Patent No.: US 6,717,156 B2
(45) Date of Patent: Apr. 6, 2004

(54) BEAM AS WELL AS METHOD AND EQUIPMENT FOR SPECIMEN FABRICATION

(75) Inventors: Masakazu Sugaya, Kawasaki (JP); Hiroyasu Shichi, Tokyo (JP); Muneyuki Fukuda, Kokubunji (JP); Kaoru Umemura, Musashino (JP); Hidemi Koike, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/078,397

(22) Filed: Feb. 21, 2002

(65) Prior Publication Data

US 2002/0166976 A1 Nov. 14, 2002

(30) Foreign Application Priority Data

May 8, 2001 (JP) ........................................ 2001-136829

(51) Int. Cl.⁷ ............................................. H01J 37/256
(52) U.S. Cl. ............................. 250/440.11; 250/492.1; 250/377; 73/864.91
(58) Field of Search ........................... 250/490.11, 310, 250/311, 397, 492.1; 73/864.91

(56) References Cited

U.S. PATENT DOCUMENTS

| 5,656,811 | A | * | 8/1997 | Itoh et al. ................ 250/309 |
| 5,727,915 | A | * | 3/1998 | Suzuki ..................... 414/1 |
| 6,300,631 | B1 | * | 10/2001 | Shofner .................... 250/311 |
| 2002/0050565 | A1 | * | 5/2002 | Tokuda et al. ............ 250/492.1 |
| 2002/0079463 | A1 | * | 6/2002 | Shichi et al. ............. 250/492.1 |
| 2002/0121614 | A1 | * | 9/2002 | Moore ...................... 250/492.1 |

FOREIGN PATENT DOCUMENTS

| JP | 03-154784 | | 7/1991 | |
| JP | 08-132363 | | 5/1996 | |
| WO | 99/05506 | | 2/1999 | |
| WO | WO 99/17103 | * | 4/1999 | .......... G01N/23/00 |

OTHER PUBLICATIONS

L.A. Giannuzzi et al., "Focused ion beam milling and micromanipulation lift–out for site specific cross–section TEM specimen preparation," *Mat. Res. Soc. Symp. Proc.*, vol. 480, pp. 19–27, Materials Research Society, 1997.

* cited by examiner

*Primary Examiner*—John R. Lee
*Assistant Examiner*—James P. Hughes
(74) *Attorney, Agent, or Firm*—Antonelli, Terry, Stout & Kraus, LLP

(57) ABSTRACT

There are disclosed a method for fabricating (processing) a micro-sample used for the observation, analysis, and measurement by, for example, a transmission electron microscope (TEM), and an equipment for specimen fabrication (processing) used for carrying out the method. With the method for specimen fabrication (processing) of the present invention, a micro-sample to be separated and extracted from a specimen substrate is sandwiched and held between a plurality of branch beams formed at the tip of a beam. The beam holding the micro-sample is transferred onto a sample holder, and the micro-sample is mounted (firmly held) on the sample holder. After mounting the micro-sample on the sample holder, the beam is detached and separated from the mounted micro-sample. By adopting such a method, it is possible to fabricate a specimen for high reliability observation, analysis, and measurement entailing less contamination, in a shorter time and with efficiency.

19 Claims, 20 Drawing Sheets

BEAM AS WELL AS METHOD AND EQUIPMENT FOR SPECIMEN FABRICATION

BACKGROUND OF THE INVENTION

1. Field of the Invention

The present invention relates to a technology of extracting a micro-sample from a specimen substrate, i.e., a technology of separating, extracting, and storing of the micro-sample. More particularly, the present invention relates to a method and an equipment for separating and extracting a micro-sample including a specific region from a specimen substrate, and for storing it.

2. Description of the Related Prior Arts

In recent years, in a structure analysis of semiconductor devices, there has been demanded an observation of a very minute structure which is so small that, at a resolving power of an ordinary scanning electron microscope (hereinafter, abbreviated as an SEM), the structure cannot be observed any longer. As a result, observation by means of a transmission electron microscope (hereinafter, abbreviated as a TEM) is indispensable in place of an SEM. As for the fabrication of an observation micro-sample to be used for TEM observation, there is a method described in WO99/05506 (cited reference 1). With the method described in the foregoing cited reference 1, first, the periphery of a region desired to be subjected to an analysis on a specimen substrate (hereinafter, referred to as an observation region) is subjected to ion beam sputtering processing, thereby defining and forming the observation region. Then, the tip of a probe is firmly joined to the observation region thus defined and formed. Subsequently, in order to separate the observation region from the specimen substrate, ion beam sputtering processing is performed thereon to separate and extract a micro-sample including the observation region from the specimen substrate. Then, the micro-sample separated and extracted while being firmly joined to the probe tip is transferred to a position at which a sample holder exists. The extracted micro-sample is then fixed on the sample holder. Thus, the probe tip is cut off from the micro-sample by an ion beam sputtering method. With the foregoing operation, separation and extraction of the micro-sample, and firm attachment (storing) of the micro-sample onto the sample holder are completed. Thereafter, a desired observation, analysis, and measurement are performed on the observation region on the micro-sample which has been cut off from the probe tip and firmly attached on the sample holder.

Further, as another method, in Japanese Published Unexamined Patent Application No. Hei 8-132363 (cited reference 2), there is proposed a two-finger microhand mechanism whereby a minute micro-sample is held by effecting extension and contraction of two hands by piezoelectric elements by means of a parallel linkage. As still other method, in Japanese Published Unexamined Patent Application No. Hei 3-154784 (cited reference 3), there is proposed a tweezers mechanism using bimorph type piezoelectric elements as driving sources. With either of these methods, the micro-sample is held by moving the hands or tweezers by using piezoelectric elements.

Further, in the section in the literature (cited reference 4) entitled "Specimen Preparation for Transmission Electron Microscopy of Materials IV" on pages 19 to 27 of Material Research Society (MRS) Symposium Proceedings, vol. 480, L. A. Giannuzzi et. al., disclose a Lift-Out method. With this method, a thin specimen portion for TEM observation is formed in a specimen substrate by using an FIB (Focused Ion Beam) (corresponding to the steps of FIGS. 21A to 21G). After formation of the thin specimen portion, the specimen substrate is taken out into the air, and placed under an optical microscope. Thus, a sharpened glass rod is brought to the proximity of the thin specimen portion. Then, the sharpened tip of the glass rod is pressed against a part of the thin specimen portion to separate the thin specimen portion from the specimen substrate. Further, the tip of the same glass rod is brought to the proximity of the separated thin specimen portion. Accordingly, the thin specimen portion is allowed to electrostatically adsorb to the glass rod tip by the static electroricity occurring at the glass rod tip. The thin specimen portion adsorbed and held on the glass rod tip is transferred onto a carbon film-coated hollow grid, and the thin specimen portion is attached to, and held by the hollow grid so as to face the carbon film. The hollow grid holding the thin specimen portion is introduced into a specimen chamber of a TEM to permit the TEM observation of the thin specimen portion.

Still further, in WO99/17103 (cited reference 5), mention is made of the use of tweezers for extracting a micro-sample. However, neither disclosure nor suggestion is made on the mechanism or the structure of the ones referred to as the tweezers.

The foregoing prior art technologies have the problems as shown below.

A first problem is in that contamination may be caused on the micro-sample and the specimen substrate upon extracting the micro-sample. In the prior art technology disclosed in the cited reference 1 described above, when the probe tip is firmly joined to the vicinity of the observation region of the specimen substrate, the firm joining therebetween is established through an ion beam assisted deposition film (hereinafter, referred to as a deposition film) or an ion beam sputtered particle redeposition film. This entails the following problem. When an assist gas to be the raw material for the deposition film is supplied, the observation region in the micro-sample and the neighboring region thereof are contaminated by the assist gas. The region which has been once contaminated is difficult to define. Further, it also causes failures in the subsequent and later steps. Still further, the contaminated region may also be expanded according to the steps. In such a case, unfavorably, the specimen substrate cannot be used for observation or analysis in the subsequent and later steps any longer.

A second problem is a problem associated with the extraction of the micro-sample. The cited reference 1 has a description to the effect that an electrostatic adsorption method may be used as the method for firmly joining the probe tip to the micro-sample. Further, the method in which the micro-sample is held by utilizing the electrostatic adsorption force at the glass rod tip is known as the Lift-Out method (the cited reference 4). With this method, there occurs no problem of contamination on the micro-sample because the electrostatic adsorption method is used. However, since the micro-sample is minute, a sufficient electrostatic force cannot be given thereto. Accordingly, the micro-sample is difficult to hold with stability. Specifically, with this method, when the separated minute micro-sample is transferred onto the grid, the specimen substrate is taken out into the air (into a laboratory), and then the micro-sample is electrostatically adsorbed to the glass rod tip. Therefore, the electrostatic adsorption force of the micro-sample to the glass rod tip largely depends on the humidity in the laboratory. For this reason, it may happen that, the micro-sample cannot be adsorbed to be separated and extracted from the specimen substrate, or the micro-sample is dropped during transfer onto the grid. This results in a very low probability (success rate) that the micro-sample can be ideally attached onto the carbon film. Further, the thin specimen is not always adsorbed to the tip of the glass rod, and it is often attached to the side of the glass rod according to the distribution of the generated electrostatic force. In this case, it is not possible to attach the micro-sample onto the carbon film-coated surface on the grid. Once the micro-sample is adsorbed to the side of the glass rod, the micro-sample cannot be transferred to the tip of the glass rod afterward because the micro-sample is a thin piece with very minute dimensions of about several micrometers to ten and several micrometers per side. After all, the micro-sample cannot be attached onto the carbon film-coated surface of the grid, and hence it cannot be made available for use as a TEM specimen. Particularly, in the failure analysis of a semiconductor device, the site to be noted as the observation region is determined. Therefore, the micro-sample to be extracted can be said to be unique. Accordingly, with the method for separating and extracting the micro-sample utilizing the electrostatic adsorption force to the glass rod, the probability is low that a specimen which can be made available for use as a TEM specimen can be obtained. Such a low reliability specimen fabrication method may be inapplicable to the failure analysis of a very minute structured element of a semiconductor integrated circuit or the like. Further, with the method utilizing the static electricity, on the contrary, even the following case could occur: the minute micro-sample is flicked to an undesired site by a repulsive force due to the static electricity, so that the important micro-sample is lost. Thus, unfavorably, the method utilizing the electrostatic adsorption force becomes the very unreliable method for holding a micro-sample.

A third problem is a problem associated with the working efficiency during extraction of a micro-sample, i.e., the throughput, and the equipment configuration. The two-finger microhand mechanism described in the cited reference 2 adopts a method for holding a minute micro-sample by two microhands with a high degree of freedom. However, with this method, the two microhands are required to be positioned and set so as to allow holding of the micro-sample with precision. This operation is complicated, and requires a skill. This presents a large obstacle to practical use thereof. Specifically, with such a mechanism for holding a minute micro-sample in micrometers as the two-finger microhand mechanism, a movable beam having an independent configuration is required to be used. Since the micro-sample serving as an object to be held is a very minute thin piece with a size in micrometers, the tip of the movable beam as a hold system for holding this is also required to have a size in micrometers. Therefore, also for the alignment of the hold system tip, a very high alignment precision in units of micrometers or in smaller units is inevitably required. The act of performing such a high precision alignment by using two independent movable beams involves the operation which is very complicated, and requires a skill. Further, with the method for holding the very minute micro-sample by the two-finger microhand system of the independent movable beams, it is required to manipulate and control the holding force for holding the micro-sample and the relative positional relationship between respective contact positions of the two microhands with the micro-sample. This also results in an operational problem of the lack in the stability and the reliability during holding of the micro-sample. Still further, as a mechanical problem, since a parallel linkage using piezo elements as driving sources is used, also unfavorably, the equipment configuration increases in scale.

Further, the tweezers mechanism described in the cited reference 3 also has a problem that the operation which is complicated and requires a skill is unavoidable for holding a micro-sample as with the method described in the cited reference 2. Still further, with the tweezers mechanism described in the cited reference 3, bimorph type piezoelectric elements are used as the driving sources. Therefore, it cannot choose but to place the tweezers mechanism for holding the micro-sample and the bimorph type piezoelectric elements for driving the tweezers mechanism at mutually separated positions. In consequence, unfavorably, it is difficult to ensure the operation precision required for holding a minute micro-sample in micrometers.

For these reasons, with the prior art technologies, it is very difficult to extract a very minute micro-sample in micrometers without contaminating the micro-sample and/or the neighboring region, and hold the minute micro-sample with precision and stability at the same time.

SUMMARY OF THE INVENTION

The present invention has been completed in view of the forgoing problems in the prior art. It is therefore an object of the present invention to provide an equipment and a method capable of stably separating, extracting, and storing a very minute micro-sample with precision and a high throughput without contaminating the very minute micro-sample and/or the peripheral region.

Namely, in accordance with the present invention, there are provided a means and a method for minimizing the contamination of the peripheral region of a minute micro-sample when the micro-sample is extracted from the specimen, and holding and extracting, and further storing it with precision and stability.

An equipment for specimen fabrication in accordance with one example of the present invention is configured by including: a stage movable with a specimen substrate mounted thereon; an ion beam irradiating optical system made up of an ion source for generating an ion beam, and an ion beam optical system for irradiating the ion beam to a prescribed position on the specimen substrate; a beam made up of a rod-like member having a shape in which its tip is formed thinner as compared with its root, and the tip is split into two units, for holding a micro-sample portion to be separated and extracted by pressing into the specimen substrate, and then separating and extracting the micro-sample portion from the specimen substrate by pulling it out of the specimen substrate; a sample hold system including the beam at its tip, and being capable of rotating the beam; a transfer system for transferring the sample hold system relative to the specimen substrate; a contact detection system for detecting the contact state between the beam and the micro-sample; and a vacuum chamber for accommodating the whole of these components.

Then, a description will be given to one example of a method for separating and extracting a minute micro-sample from the top of the specimen substrate, and storing it in a prescribed place by using the foregoing equipment for specimen fabrication in accordance with one example of the present invention.

First, as a first step, the specimen substrate is mounted on the stage to determine an observation region (a portion to be separated and extracted as a micro-sample). Subsequently, a part of the peripheral portion is left as a residual area, and the observation region is processed into a micro-sample shape to be able to be separated and extracted by an ion sputtering method.

Then, as a second step, the micro-sample being connected to (temporarily held by) the specimen substrate by the residual area is held by pressing the micro-sample portion into the tip split into two units, of the beam made up of the rod-like member so configured that its tip is formed thinner as compared with its root, and the tip is split into two units (hereinafter, beam), attached at the tip of the sample hold system. Then, the beam is pull out of the specimen substrate, and thereby, the micro-sample portion is separated from the specimen substrate. Namely, upon holding the micro-sample, holding is achieved by moving the rod-like member so as to insert the micro-sample into the portion in the shape in which the tip is split into two units while extending the portion by force.

Then, as a third step, the specimen held by the beam is formed into the micro-sample separated from the specimen substrate by removing the residual area by an ion beam sputtering method.

Then, as a fourth step, the micro-sample held by the returning force (restoring force) of the beam is extracted from the specimen substrate by relatively moving the sample hold system or the specimen stage.

Further, in a fifth step and later steps, in accordance with the objects and the necessities, it is possible to subject the micro-sample separated and extracted by the foregoing steps up to the fourth step to analysis, observation, processing, and the like. Herein, as a typical example thereof, a description will be given to a method for manufacturing a micro-sample for observation in order to perform TEM observation.

Namely, as a fifth step, the micro-sample separated and extracted by the previous fourth step is rotated to a given angle by the function of rotating the beam provided to the sample hold system. By using the rotary function, if required, the micro-sample is rotated to a given angle, and subjected to additional processing into a micro-sample shape preferable for TEM observation by an ion beam sputtering method. Examples of the additional processing into a micro-sample shape preferable for TEM observation include the processing of a part or the whole of the separated and extracted micro-sample into a micro-sample shape thinned to a thickness capable of TEM observation. Incidentally, the fifth step may be carried out, if required. This step is not required to be carried out when the micro-sample is thinned by another method or step, or in other cases. For example, when the micro-sample is thinned by using an ion beam sputtering method after holding the micro-sample on the micro-sample holder in a sixth step and later steps described below, additional thinning processing is not required to be carried out in this fifth step.

Then, in a sixth step, for example, the micro-sample is mounted on the micro-sample holder for TEM observation disposed on the specimen stage. There are the micro-sample holders for TEM observation, having various configurations. Appropriately, an appropriate mounting method should be adopted according to the configuration of the holder. For example, in the present invention, a holder with a trench for insertion of the micro-sample into which the micro-sample can be inserted is provided in advance by an ion beam sputtering method. Then, by the beam, the micro-sample held by it through the returning force of the beam itself is transferred to the trench for insertion of the micro-sample on the micro-sample holder. Then, the micro-sample is inserted and fixed in the trench, and thus the beam is transferred in such a direction that the micro-sample will not come out of the trench. As a result, the micro-sample and the beam are separated from each other, allowing the micro-sample to be mounted on the holder. Other than this, mounting of the micro-sample on the holder is accomplished in the following manner. For example, an ion beam assisted deposition film (deposition film) is formed at the contact portion between the micro-sample and the holder. The micro-sample is firmly joined onto the holder by this deposition film. Then, the sample hold system is operated, so that the beam and the micro-sample are relatively moved. In consequence, the beam and the micro-sample are separated from each other. This separation can also be accomplished by adopting the following method. Namely, with a part of the micro-sample firmly joined onto the holder, a part of the beam holding the micro-sample (micro-sample holding portion) is cut by an ion beam sputtering method, so that the micro-sample and the beam are separated (detached) from each other. Incidentally, it is also possible to carry out the foregoing steps up to the sixth step in a vacuum chamber (namely, in a vacuum atmosphere). Namely, it is possible to carry out all the steps of from the step of determining the portion desired to be observed on the specimen substrate, and holding and extracting the observation region by the physical force from the specimen substrate as the micro-sample, to the step of subjecting it to thinning processing as the TEM specimen in the vacuum chamber.

A seventh step is a step of extracting the micro-sample mounted on the sample holder together with the holder from the specimen fabrication equipment, and performing desired analysis, observation, measurement, and the like with respect to the micro-sample by using a TEM apparatus disposed together with or separately from the specimen fabrication equipment.

Incidentally, in the fifth step and later steps described above, it is possible to fabricate micro-samples in accordance with apparatuses for performing various other analyses, observations, measurements, and the like by using the same method, not limited to fabrication of the micro-sample for TEM observation. Further, in the foregoing fifth step, by using a rotary system disposed in the sample hold system for the micro-sample held by the beam, it is possible to rotate the micro-sample to a given desired angle, and to perform analysis, observation, measurement, and the like, on the spot. Still further, by adopting an additional processing method of the micro-sample by an ion sputtering method for performing the analysis, observation, measurement, and the like, it is also possible to perform the analysis, observation, and measurement while arbitrarily subjecting the micro-sample to additional processing, and to use the secondary products such as secondary ions, neutral particles, and an X-ray occurring upon the additional processing for analysis and observation. Still further, in the previous fourth step and later steps, the sample hold system or the beam holding the micro-sample is so configured as to be separable and detachable from the specimen fabrication equipment main body. In addition, the sample hold system or the beam is used in common for holding the specimens for other analysis apparatuses or the like, typically such as the TEM apparatus. In consequence, it is also possible that the micro-sample separated and extracted from the specimen substrate is analyzed, observed, and measured with these other analysis apparatuses. In this case, it is possible not only to shorten the analysis time, but also to perform reprocessing or additional processing of the micro-sample by using an ion beam sputtering method by mounting it in the specimen fabrication (processing) equipment again after analysis, observation, and measurement with these other analysis apparatuses.

Then, a description will be given to the configuration, function, and the like of the beam used in the foregoing method. As described in the paragraph of the prior art, for holding the minute micro-sample by two independent movable beams in accordance with the prior art method, a high precision alignment operation of the movable beam tips is required. In addition, as described previously, unfavorably, the minute micro-sample is difficult to hold with reliability. In contrast, in the present invention, the alignment of the beam tip for holding the micro-sample is essentially unnecessary. Further, it is possible to hold the micro-sample with reliability. As a specific method, the micro-sample sandwiched in the beam tip, and thus extracted from the specimen substrate is inserted and held in the trench for insertion of the micro-sample disposed on the sample holder. Thus, the micro-sample is pulled out of and separated (detached) from the beam. The beam is a beam made up of a rod-like member having a shape in which its tip is formed thinner as compared with its root, and the tip is split into two units. By sandwiching and holding the micro-sample between the beam tip split into two units, the micro-sample is held through the elastic deformation force of the beam tip without using a piezoelectric element or the like.

As a method for manufacturing the beam, specifically, the rod-like member is previously subjected to narrowing processing so that its tip diameter is about several micrometers by using an electropolishing method or an etching processing method. Further, the narrowed beam tip is subjected to slit processing by an ion beam sputtering method, thereby forming a beam with its tip branched into a plurality of (generally two) units. At this step, the current value of the irradiated ion beam is increased for rough processing, while the current value is reduced for finishing processing. This allows precision processing. The previously electropolished probe (beam) is accommodated in an ion beam processing apparatus. According to the purpose, the probe tip can be processed into a given shape. The beam is processed into such a shape in which the tip has a plurality of branch units. By pressing (inserting) a minute micro-sample in between the plurality of the branch units of the beam, the minute micro-sample is held therein. The micro-sample held between a plurality of the branch units in this manner is held in a sandwiched manner through a restoring force generated by the elastic deformation of the beam itself (i.e., the branch units themselves). This allows reliable and stable holding of the micro-sample. Incidentally, the slit processed and formed at the beam tip by an ion beam sputtering method is more desirably formed into a shape in which the slit width of the slit entrance is larger than the slit width of the slit inside for facilitating insertion of the micro-sample thereinto.

As described above, by adopting the beam having the foregoing configuration in accordance with the present invention as a means for holding the micro-sample, it is possible to easily obtain the beam for holding a very minute micro-sample by the configuration and the manufacturing method. Further, a plurality of the tip branch units and the beam main body are integrally formed in one piece by performing the foregoing slit processing on the beam tip. Therefore, as compared with the case where other objects are joined together as the tip branch units to configure a plurality of tip branch units, alignment of the beam tip for holding the minute micro-sample is not required at all.

With the method of the present invention, it is possible to fabricate a beam having two tip branch units, as one specific example of the configuration of the beam, which has two tip branch units, wherein a slit for insertion of the micro-sample, with a width W of 2 $\mu$m and a length L of 30 $\mu$m, is disposed between both the tip branch units, and the tip diameter S and the root diameter X of the each tip branch unit are processed and formed to be 1 $\mu$m and 3.5 $\mu$m, respectively. Therefore, the beam having the forgoing configuration in accordance with the present invention can solve the problems in holding of a micro-sample in the prior art. Further, for holding the minute micro-sample, the elastic deformation force occurring in the tip branch units themselves with sandwiching of the micro-sample in between the tip branch units is utilized, and a deposition film formation method through irradiation with an ion beam is not used for holding the micro-sample as in the prior art. Therefore, there are no factors causing contamination of the micro-sample. In other words, in principle, there occur no factors causing contamination on the micro-sample sandwiched and held between the tip branch units of the beam in accordance with the present invention, and its neighboring region. In addition, the micro-sample hold means in accordance with the present invention can implement holding of the micro-sample by the following simple operation. Namely, the micro-sample is inserted in between the tip branch units formed at the beam tip. Thus, by utilizing the elastic deformation force occurring in the tip branch units themselves, the minute micro-sample is held therein in a sandwiched manner. This produces the following effects. Namely, it is possible not only to shorten the time required for holding, extracting, and storing the micro-sample, but also to markedly improve the throughput during the holding operation of the micro-sample. As a result, the productivity of the micro-sample fabrication can be improved. Specifically, with a prior-art method for fabricating a micro-sample for TEM observation, about 1 hour is required between separation and extraction of the micro-sample from the specimen substrate and storing (holding) of it on the holder. Further, about another hour is required for thinning processing of the micro-sample. However, in accordance with the method of the present invention, the time required between extraction of the micro-sample from the specimen substrate and storing (holding) of it on the holder can be shortened to about 30 minutes. Thus, the effect of shortening the time required for specimen fabrication is large.

Other objects and constitutions of the present invention than described above, and the functions and effects resulting therefrom will be obvious successively in the following detailed description by way of examples.

DESCRIPTION OF THE PREFERRED EMBODIMENTS

Figure 1:
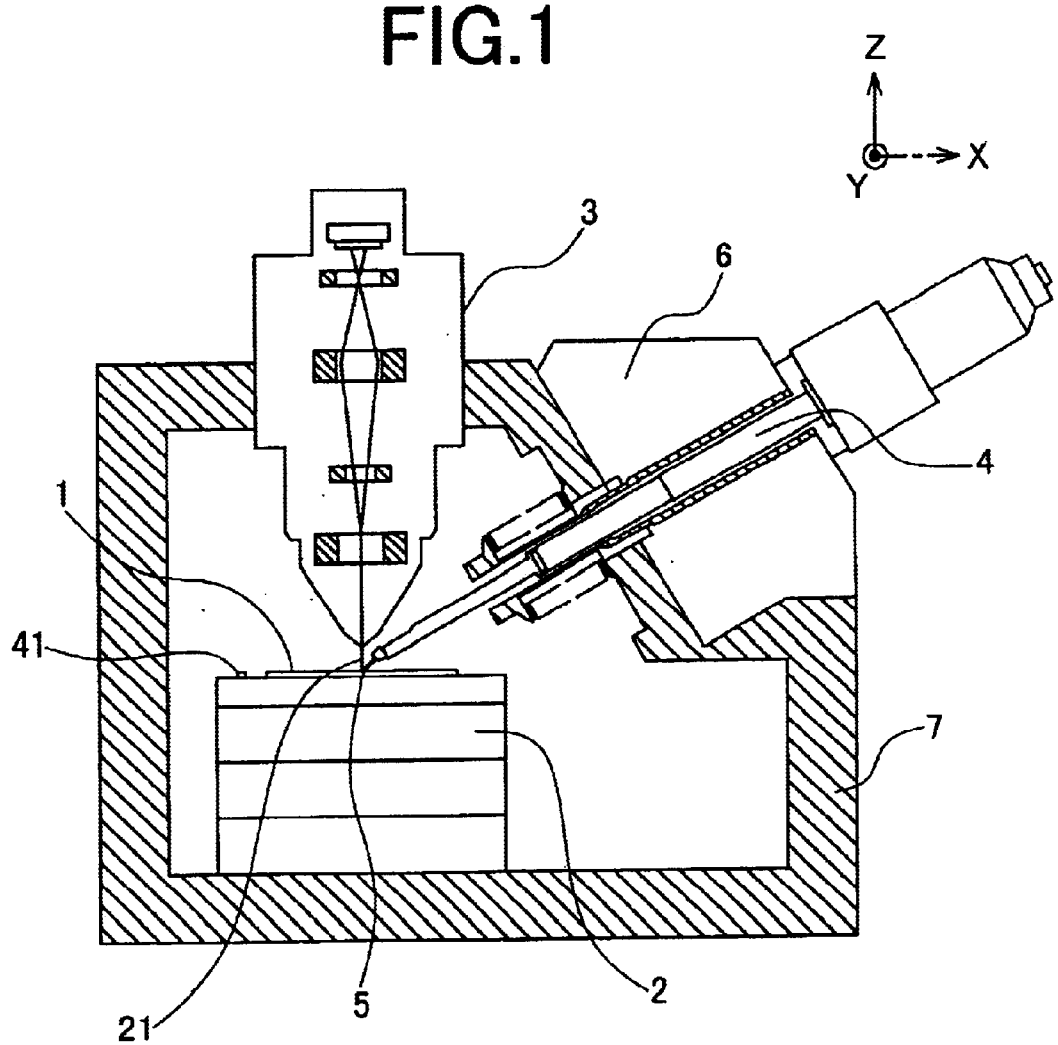
FIG. 1 is a schematic cross sectional view showing a basic configuration of a specimen fabrication equipment in accordance with a first example of the present invention.

Below, preferred examples on a beam as well as a method and an equipment for specimen fabrication using the beam in accordance with the present invention will be described in more details with reference to the accompanying diagrams. It is noted that identical reference numerals and characters shown in the diagrams are used to designate identical elements or similar elements.

EXAMPLE 1

FIG. 1 shows an example of the basic configuration of a specimen fabrication equipment capable of separating and extracting a micro-sample, for example, a specimen fabrication equipment by ion beam processing (hereinafter, simply referred to as a specimen fabrication equipment) in accordance with an example of the present invention.

FIG. 1 schematically shows a configuration of a cross section of the specimen fabrication equipment in accordance with this example. In FIG. 1, a reference numeral 1 denotes a specimen substrate including an observation region, which may be, for example, a semiconductor wafer, a semiconductor chip, or a glass substrate or a crystal substrate. In this example, a description will be given by using a semiconductor wafer as an example of the specimen substrate 1. A reference numeral 2 denotes a specimen stage movable with the specimen substrate 1 mounted thereon. In this example, a stage capable of eucentric movement having five axes of X, Y, Z, rotation, and tilt was used. A reference numeral 3 denotes an ion beam irradiating optical system made up of an ion source for generating an ion beam and an ion beam optical system for irradiating the ion beam to a prescribed position. It supplies an ion beam 21 for separating a micro-sample including the observation region from the specimen substrate 1, or processing the separated and extracted micro-sample. A reference numeral 4 in FIG. 1 denotes a sample hold system for holding the micro-sample. To the tip thereof, there is attached a beam made up of a rod-like member having a shape in which the tip is thinner as compared with the root, and the tip is split for holding a specimen (hereinafter, simply referred to as a beam) 5. The micro-sample is held by the elastic deformation force of the rod-like beam itself. Further, the sample hold system 4 has a function of rotating the beam 5, and is used for holding of the micro-sample, alignment of the beam 5 and the micro-sample at the time of extraction, and the like. A reference numeral 6 in FIG. 1 denotes a transfer system for transferring the sample hold system 4 relative to the specimen substrate 1. In this example, a transfer system having a function of transfer in the directions of three axes of X, Y, and Z was used. A reference numeral 7 in FIG. 1 denotes a vacuum chamber in which the stage 2 is included and the ion beam irradiating optical system 3 and the transfer system 6 are mounted. It has a function of maintaining a desired vacuum state by evacuating the inside of the vacuum chamber with an evacuator not shown. Further, the transfer system 6 has a function capable of separation and detachment of the sample hold system 4 therefrom. It has a closable valve (not shown) so that the degree of vacuum of the vacuum chamber 7 can be kept upon separating and detaching the sample hold system 4. Further, a reference numeral 41 in the diagram denotes a sample holder for storing the micro-sample. In this example, it is placed on the surface of the stage 2 on which the specimen substrate 1 is mounted.

Figure 2:
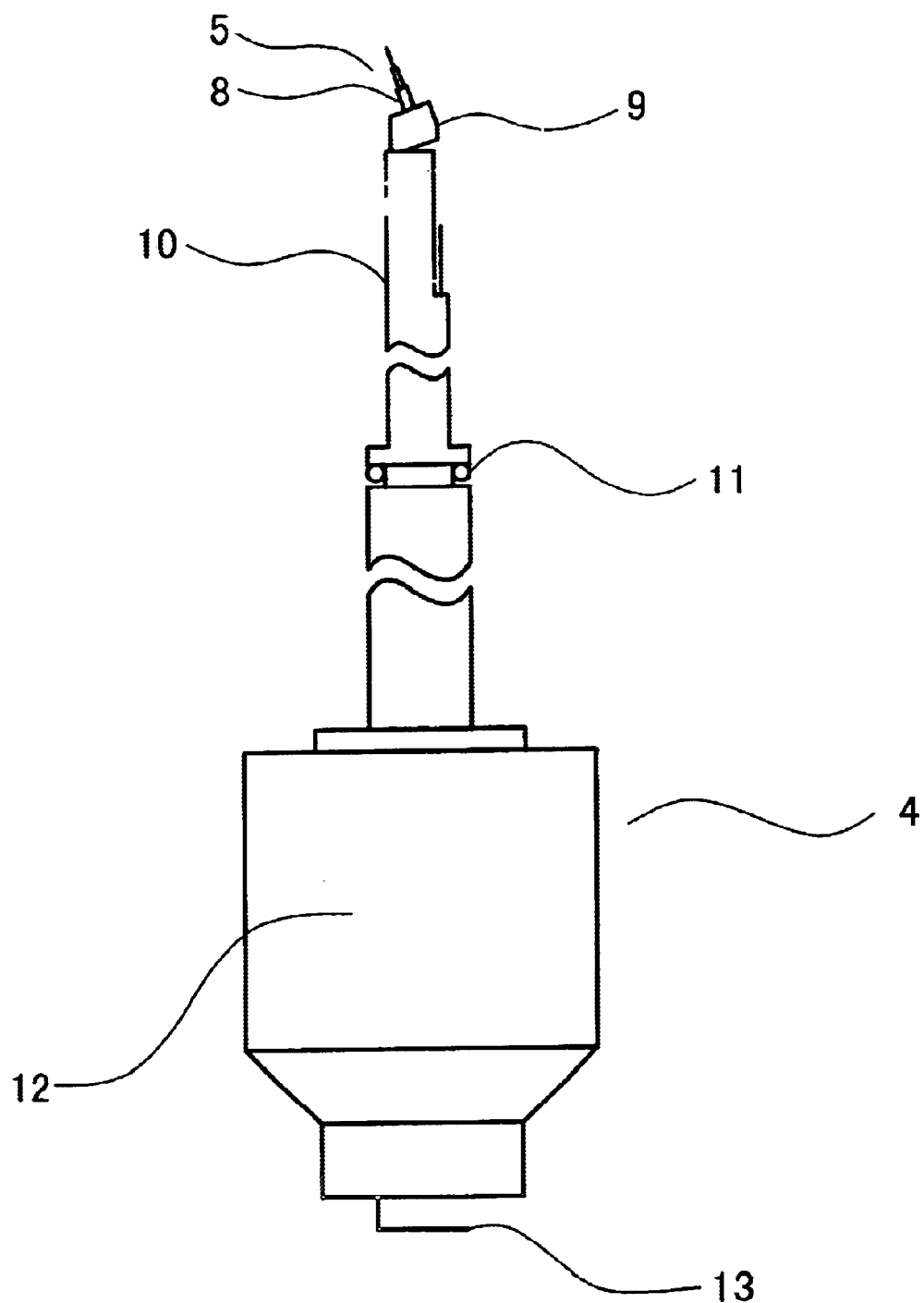
FIG. 2 is a schematic external view showing a specific configuration of a sample hold system portion in the specimen fabrication equipment in accordance with the first example of the present invention shown in FIG. 1.

FIG. 2 shows a configuration of an outward appearance of the sample hold system 4. The beam 5 shown in FIG. 2 is the beam as described above, and it is connected to a base block 9 at the tip of the sample hold system 4 via a holder 8.

Further, the beam 5 is detachable from the holder 8. As described above, the sample hold system 4 has a system for rotating the beam 5. The rotary system is provided in the inside of a protective tube 10. The protective tube 10 has a function of protecting the beam 5 and the micro-sample held by the beam 5 by storing them in its inside upon detaching the sample hold system 4 from the transfer system 6. Specifically, the base block 9 and the protective tube 10 relatively move, so that the beam 5 is stored together with the base block 9 in the protective tube 10. In FIG. 2, a reference numeral 11 denotes an O-ring for vacuum sealing, attached to the protective tube 10, and it is for keeping the vacuum in the vacuum chamber 7 upon mounting in the transfer system 6. A reference numeral 12 in FIG. 2 denotes a rotary drive system including therein a driving source for rotating the beam 5 and an encoder for detecting the angle of rotation of the beam 5, and a contact detection device for detecting the contact between the beam and the specimen held by the beam. A terminal 13 disposed on the rotary drive system 12 is provided for receiving the power supply from a power source and allowing passage of a control signal for rotation with a specimen fabrication equipment which is a main body.

Figure 3A:
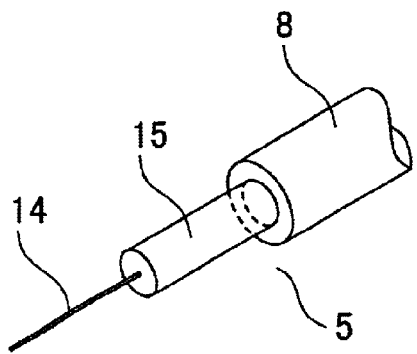
FIGS. 3A to 3F are schematic views respectively showing specific configuration examples of the tip of a beam used in the sample hold system portion in the specimen fabrication equipment in accordance with the first example of the present invention shown in FIG. 2.
Figure 3C:
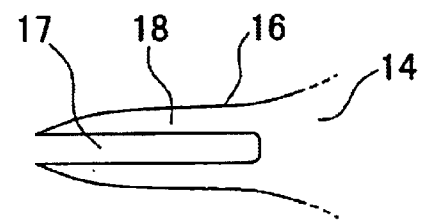
Figure 3B:
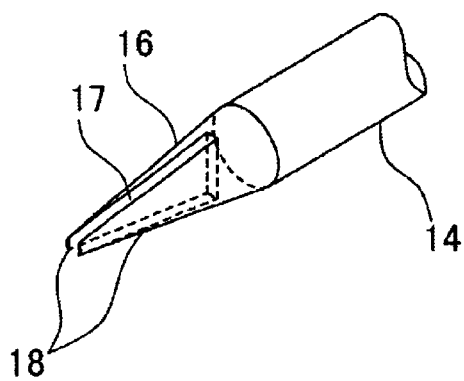
Figure 3D:
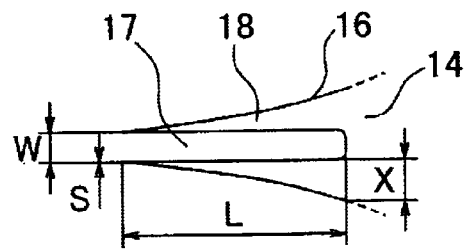
Figure 3E:
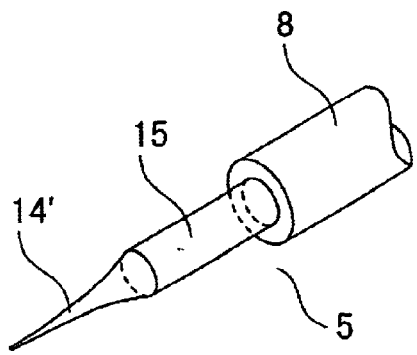
Figure 3F:
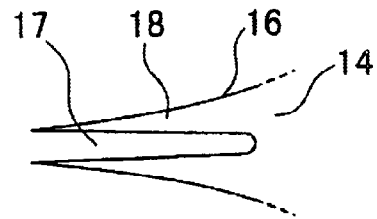

Then, the beam 5 will be described in details by reference to FIGS. 3A to 3F. FIG. 3B is an enlarged external view of the beam 5. In the drawing, a reference numeral 14 denotes a metal beam having an electric conductivity. The tip thereof is, as shown in FIG. 3B, processed into branch beams 18 split by a slit 17. The metal beam 14 is firmly joined to a fixed axis for metal beam 15 which similarly has an electric conductivity by using spot welding or a conductive adhesive. Thus, the beam 5 is made up of the metal beam 14 and the fixed axis for metal beam 15. Further, the fixed axis for metal beam 15 is joined to the specimen hold system 4 via the separable and detachable holder 8 as described above. In this example, as examples of the components of the beam 5, mention is made of the metal beam 14 and the fixed axis for metal beam 15 having an electric conductivity. However, the materials for constituting the metal beam 14 and the fixed axis for metal beam 15 are not required to be limited to metals. For example, a conductive ceramic and a conductive plastic having an electric conductivity, a ceramic having no electric conductivity at all, and an insulating material such as a resin may also be used. As described later, there is no problem so long as the branch beams 18 split by the slit 17 for holding a micro-sample can undergo elastic deformation for holding the micro-sample. FIG. 3B is an enlarged view of the tip of the metal beam 14. At the tip of the metal beam 14, there is provided a tapered shape portion 16 in which the tip is thinner as compared with the root of the metal beam 14. In this diagram, as the typical shape example, the tapered shape portion tapering toward the tip is shown. Therefore, the tapered shape portion 16 may be the tapered shape portion made up of the curve as shown in FIGS. 3C and 3D in plan view. Further, to the tip of the tapered shape portion 16, there are disposed the branch beams 18 split by the slit 17. Each branch beam 18 split by the slit 17 has an elasticity, so that the micro-sample inserted in the slit 17 is held in a sandwiched manner by a holding force resulting from the elastic deformation of the branch beams 18. Further, as shown in FIG. 3F, the slit 17 processed by an ion beam sputtering method is desirably formed in the shape in which the slit width at the slit entrance is larger than the slit width of the back in the slit for facilitating the insertion of the micro-sample thereinto. In this example, for example, a 50 $\mu$m-dia tungsten thin needle with the shape shown in FIG. 3D was used for the metal beam 14, and a 0.8 mm-dia tungsten thin needle was used for the fixed axis for metal beam 15. Thus, the beam 5 was manufactured which has the slit 17 having a geometry of 2 $\mu$m (W in FIG. 3D)×30 $\mu$m (L in FIG. 3D), and has two branch beams 18 each having a tip diameter of 1 $\mu$m (S in FIG. 3D) and a root diameter of 3.5 $\mu$m (X in FIG. 3D). Incidentally, needless to say, the beam 5 shown in FIG. 3A is not necessarily required to be made up of the metal beam 14 and the fixed axis for metal beam 15, and as shown in FIG. 3E, the metal beam 14 and the fixed axis for metal beam 15 may be made up of the same continuous member 14'.

By using the forgoing configuration for the beam 5, it is possible to obtain the following effects. First, since the configuration of the beam 5 is simple, it is possible to obtain a holding means for holding a very minute micro-sample with a simple configuration, without adopting a complicated configuration. Secondly, the branch beams 18 for holding the micro-sample can be obtained by forming the slit 17 at the tip of the metal beam 14. As compared with the case where the branch beams 18 are formed by joining together two independent metal beam pieces with alignment, not depending on the formation of such a slit 17, in the case where the two branch beams 18 are integrally formed from one-piece metal member by beam processing as in this example, the operation of alignment between both the branch beam tips becomes unnecessary. Thirdly, the micro-sample is inserted in the slit 17, and pushed in between the branch beams 18 to be held. Therefore, it is possible to hold the micro-sample with a simple operation. Fourthly, since it is possible to obtain a sufficient holding force for holding the micro-sample due to elastic deformation of the branch beams 18, it is possible to hold the micro-sample with stability and reliability. Fifthly, by selecting the material and the geometry of the beam 5 according to the characteristics of the micro-sample to be extracted, it is possible to respond to a request for extraction of a large number of kinds of micro-samples with ease. Sixthly, by selecting and forming the geometry of each of the branch beams 18 according to the geometry of the micro-sample to be extracted, it is possible to respond to a request for extraction of micro-samples having various geometries with ease.

Then, a description will be given to a method for extracting a micro-sample by using a micro-sample extraction means with the configuration described above.

The observation region on the specimen substrate 1 has been previously confirmed by CAD data, optical microscope images, SEM images, scanning ion microscope images (hereinafter, SIM images), or the like. If required, it is subjected to marking for determining the portion to be extracted (observation region), or the like. FIGS. 4A to 4I show the processes up to separation and extraction of the micro-sample including the observation region from the determined region on the specimen substrate.

Step A (FIG. 4A): In the vicinity of a region to be separated and extracted as a micro-sample on the specimen substrate 1, a rectangular hole 20 is processed and formed by using a focused ion beam (hereinafter, abbreviated as an FIB). In this example, as the rectangular holes 20, for example, two parallelly arranged holes 20 of 10 ×m×3 $\mu$m×15 $\mu$m (depth) were processed and formed at an interval between the rectangular holes of 30 $\mu$m.

Step B (FIG. 4B): The FIB 21 is scanned from one of the rectangular holes 20 to form a thin long vertical trench 22. At this step, the thin long vertical trench 22 is processed and formed with a residual area 23 left. The residual area 23 plays a role of holding a micro-sample portion 24 to be separated with respect to the specimen substrate 1. In this example, for example, as the thin long vertical trench 22, the trench 22 with a width of 2 $\mu$m, a length of 28 $\mu$m, and a depth of 15 $\mu$m was processed and formed with a residual portion with a width of about 2 $\mu$m left as the residual area 23.

Step C (FIG. 4C): By tilting the stage 2, the specimen substrate 1 is tilted relative to the FIB 21. By scanning the FIB 21, an inclined trench 24 connecting between the two rectangular holes 20 is processed and formed at a position opposed to the thin long vertical trench 22. At this step, the specimen substrate 1 is tilted by the stage 2. Accordingly, the inclined trench 24 processed by the FIB 21 is connected to the thin long vertical trench 22 through the bottom of the micro-sample. As a result, the micro-sample 25 is formed with only the residual area 23 left and an incision made in the whole peripheral portion of the micro-sample. In this example, for example, the angle of tilt of the specimen mounting stage 2 was set at 20 degrees, so that the inclined trench 24 with a width of 2 $\mu$m and a depth of about 15 $\mu$m was processed and formed.

Step D (FIG. 4D): The withdrawn sample hold system 4 (not shown) is operated by the transfer system 6 (not shown), so that the beam 5 is brought to the proximity of the micro-sample 25. In the diagram, only the metal beam 14 and the branch beams 18 at the tip of the beam 5 are shown. The beam 5 brought to the proximity of the micro-sample 25 is controlled in attitude to a preferred angle for allowing the branch beams 18 to hold the micro-sample 25 by means of a rotary system (not shown) disposed on the sample hold system 4. Specifically, the preferred angle for allowing the branch beams 18 to hold the micro-sample 25 is, for example, 15 to 65°.

Step E (FIG. 4E): The branch beams 18 are operated by the transfer system 6 (not shown), so that it is brought in contact with the micro-sample 25. Detection of the presence or absence of contact between the micro-sample 25 and the branch beams 18 is accomplished by detecting the changes in the voltage applied to the branch beams 18 via the beam 5.

Step F (FIG. 4F): With reference to the contact position between the branch beams 18 and the micro-sample 25, the branch beams 18 are transferred in the direction of the stage in the manner as indicated by an arrow 26 in the diagram by means of the transfer system 6 (not shown), so that the micro-sample 25 is held by the branch beams 18. At this step, the micro-sample 25 is firmly held by the holding force resulting from the elastic deformation of the branch beams 18. The holding force for the micro-sample 25 is determined by the amount of elastic deformation of the branch beams 18. Therefore, in this example, by controlling the amount of transfer of the branch beams 18 with reference to the contact position between the micro-sample 25 and the branch beams 18, the holding force for the micro-sample 25 is kept appropriately, and stable and reliable holding is allowed. In this example, for example, the amount of transfer in the direction of the arrow 26 of the branch beams 18 was set at 3 $\mu$m, and the amount of elastic deformation of the tips of the branch beams 18 was set at 0.5 $\mu$m (per branch beam), resulting in a holding force for the micro-sample 25 of $1.3 \times 10^{-5}$ kg.

Step G (FIG. 4G): The FIB 21 is irradiated and scanned to the residual area 23 again to separate the micro-sample 25 from the specimen substrate 1. In this step, the micro-sample 25 is firmly held by the branch beams 18. Therefore, even if the residual area 23 is removed by the FIB 21, there occurs no such a problem that the micro-sample 25 is flicked off and lost by an electrostatic force, or the like.

Step H (FIG. 4H): The micro-sample 25 separated from the specimen substrate 1 by the foregoing step G is detached, separated, and extracted from the specimen substrate 1 by operating the sample hold system 4 with the transfer system 6.

By the method and steps described above, the micro-sample 25 is separated and extracted from the specimen substrate 1. Thereafter, it is possible to perform, if required, various processes with respect to the separated and extracted micro-sample 25. As one example, in this example, the following thinning processing step I (FIG. 4I) is performed for fabricating a micro-sample for TEM observation.

Step I (FIG. 4I): With the micro-sample 25 separated and extracted from the specimen substrate 1 held in a sandwiched manner between the branch beams 18 at the tip of the beam 5, the FIB 21 is irradiated to and scanned to the micro-sample 25. As a result, trenches 27 for subjecting the micro-sample 25 to thinning processing are formed on opposite sides of the micro-sample 25. As a result, the thinning processing of the micro-sample 25 is performed. By carrying out this step I, it is possible to perform the thinning processing of the micro-sample 25 after separating and extracting the micro-sample 25 from the specimen substrate 1. In consequence, it is possible to easily obtain a thinned micro-sample for TEM observation.

Other than the foregoing micro-sample thinning processing, in the step I, and later steps, it is possible to perform, if required, other various processings with respect to the extracted micro-sample 25. Specifically, from the state of the step H or step I, the micro-sample 25 being held by the beam 5 is stored in the inside of a protective tube 10 of the sample hold system 4 shown in FIG. 2. Subsequently, when the sample hold system 4 disposed on the transfer system 6 is operated, so that the micro-sample 25 being stored and held in the protective tube 10 is taken out of the vacuum chamber 7, the entire sample hold system 4 including the protective tube 10 accommodating the micro-sample 25 therein is taken out of the vacuum chamber 7 through the closable vacuum valve for maintaining the degree of vacuum in the vacuum chamber 10. As a result, the micro-sample 25 is taken out into the air for the first time. The micro-sample 25 taken out into the air can be mounted in a given observation and measurement apparatus capable of analysis, observation, processing, and the like, which has the same functions and means as those of the transfer system 4 having a function capable of separation and detachment of the sample hold system 4. Examples of the observation and measurement apparatus capable of analysis, observation, processing, and the like include a TEM apparatus, an SEM apparatus, and an FIB apparatus. In this example, the micro-sample 25 was mounted together with the sample hold system 4 in the specimen chamber of the TEM apparatus from the state of the step I through the foregoing further subsequent steps. Subsequently, the micro-sample 25 was rotated and controlled to a preferred angle for TEM observation by means of the rotary system of the sample hold system 4, so that the observation of a semiconductor device formed in the micro-sample 25, or the like was carried out. Further, by performing the steps described above in reverse, it is also possible to mount the micro-sample 25 once taken out into the air in the vacuum chamber of the specimen fabrication equipment (specimen processing equipment) again, and thus to subject the micro-sample 25 to a desired additional processing. Still further, by separating the beam 5 with the micro-sample 25 held thereon from the holder 8, and mounting the micro-sample 25 in any other given specimen processing equipment, it is possible to subject the micro-sample 25 to the same processing as described above.

By using the micro-sample extraction means and the micro-sample extraction method in accordance with this example, it is possible to obtain the following more excellent effects as compared with a prior-art micro-sample extraction method. Namely, in this example, in the step of extracting the micro-sample from the specimen substrate, it is possible to perform various processings for extracting the micro-sample with minimizing the contamination inflicted on the specimen substrate and the micro-sample. Therefore, first, even if the specimen substrate after extraction of the micro-sample of a desired portion is used for the subsequent device manufacturing steps, a device failure due to the substrate contamination upon extraction of the micro-sample will not be incurred. Secondly, even if the specimen substrate after extraction of the micro-sample is mounted for use in a manufacturing apparatus which should cover the subsequent device manufacturing steps, contamination of the manufacturing apparatus will not be caused. Thirdly, also during the analysis of the extracted micro-sample, as described above, almost no contamination of the micro-sample occurs. Accordingly, the analysis precision is not adversely affected to enable a high precision analysis. Fourthly, even if the region in the vicinity of the region from which the micro-sample has already been extracted on the specimen substrate is selected as a region to be analyzed again, and another micro-sample is extracted from the selected region, almost no contamination occurs on the newly extracted micro-sample, either. This is because there are less factors for causing contamination on the region in the vicinity of the micro-sample extraction portion (the foregoing selected region for extracting another micro-sample) upon the previous micro-sample extraction. Therefore, also upon analysis of the newly extracted micro-sample, there occurs no problem of the analysis precision reduction due to the micro-sample contamination, or the like. Fifthly, it becomes possible to extract and analyze micro-samples from the same one specimen substrate, whenever necessary, for respective steps for device manufacturing. Therefore, it is possible to analyze and ascertain the effects which will be inflicted on the device performances in the respective steps for device manufacturing objectively, and with accuracy and efficiency. Sixthly, since holding of the extracted micro-sample is accomplished by utilizing the elastic deformation force of a plurality of the branch beams split and formed by slit processing of the tip of the beam. Accordingly, the steps of holding, extracting, and storing the micro-sample are simplified, so that it becomes possible to hold and extract the micro-sample with stability and promptly.

EXAMPLE 2

Figure 5:
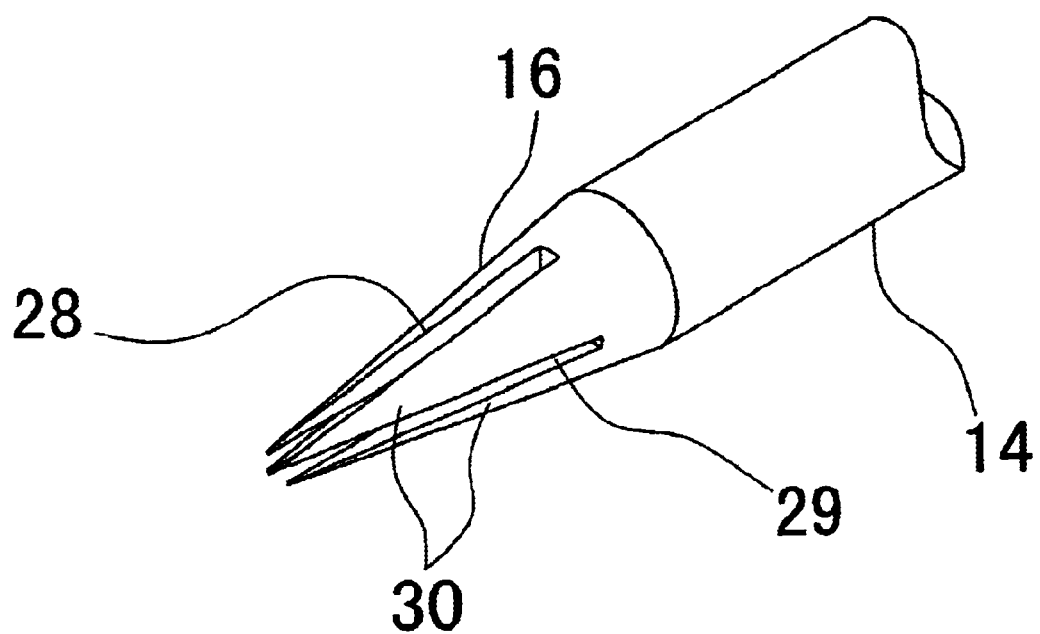
FIG. 5 is a schematic view showing a specific configuration example of the tip of a beam used in a sample hold system portion in a specimen fabrication equipment in accordance with a second example of the present invention.

Another example of the present invention will be described. FIG. 5 shows another example of the configuration of the branch beams split and formed by slits in the tip of the metal beam 14 constituting the beam 5, different from the foregoing one. A reference numeral 14 in FIG. 5 denotes a metal beam having an electric conductivity. At the tip thereof, there is provided a tapered shape portion 16 in which the tip is formed thinner as compared with the root of the metal beam 14. Further, at the tip of the tapered shape portion 16, branch beams 30 split into four pieces by slits 28 and 29 in two directions are processed and formed. As described in previous Example 1, the tapered shape portion 16 may also be the curved tapered shape portion as shown in FIG. 3C or 3D in plan view. Further, as with previous Example 1, also in this example, the beam 14 is not necessarily limited to the ones made of metal materials. For example, a conductive ceramic and a conductive plastic having an electric conductivity, and further, a ceramic having no electric conductivity at all, a resin, or the like may also be used. It is essential only that a plurality of the beams 30 split and formed by the slits 28 and 29 are capable of elastic deformation for holding the micro-sample.

By using the beam 5 with the foregoing configuration in accordance with this example, it is possible to obtain the following excellent effects as compared with the beam configuration previously described by reference to FIGS. 3A to 3F in Example 1.

First, the slits for insertion of the micro-sample are formed in different two directions. Therefore, it is possible to achieve the alignment between the micro-sample and the slits for insertion of the micro-sample upon holding of the micro-sample by a smaller amount of rotation. Secondly, it is possible to obtain the thinner branch beams 30 as the "branch beams" split and formed by the slits for firmly holding the micro-sample. Therefore, it is possible to ensure a larger elastic deformation amount of the branch beams upon holding of the micro-sample. In consequence, it is possible to respond to a request for holding of micro-samples with wider range of geometries by a single micro-sample holding means. Thirdly, since a larger number of contact points between the micro-sample and the branch beams can be ensured, it becomes possible to hold the micro-sample with more stability. Fourthly, the slits 28 and 29 are set to have mutually different slit widths, and either one of the slits is selected with respect to the micro-sample to be held. In consequence, it is possible to allow holding of the micro-samples having different width sizes by means of one micro-sample holding means. Fifthly, by setting the slit widths of the slits 28 and 29 at different widths, it is possible to form a plurality of branch beams having different cross sectional forms in one micro-sample means. Accordingly, it is possible to select the elastic deformation amount of the branch beams upon holding of the micro-sample. As a result, it becomes possible to select the holding force relative to the micro-sample. Further, in this example, a description has been given by taking the case where the branch beams split and formed into four units are formed as the branch beams 30 split by slits as an example. However, it is needless to say that the number of the branch beams, the number and the slit width size of the slits to be formed, and further the shape of the slit, and the like can be arbitrarily selected. Therefore, even when the branch beams split by slits have a three-forked configuration, or, when they are branch beams forked into more pieces, it is possible to obtain the same effects as described above.

EXAMPLE 3

Figure 6A:
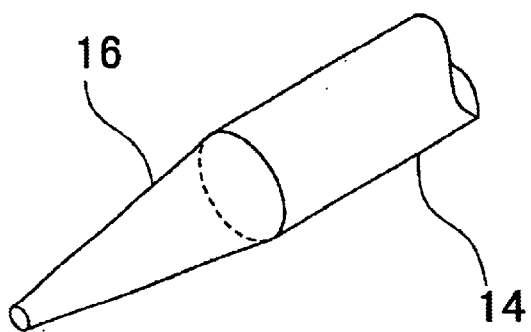
FIGS. 6A to 6C are schematic views respectively showing specific configuration examples of the tip of a beam used in a sample hold system portion in a specimen fabrication equipment in accordance with a third example of the present invention.
Figure 6B:
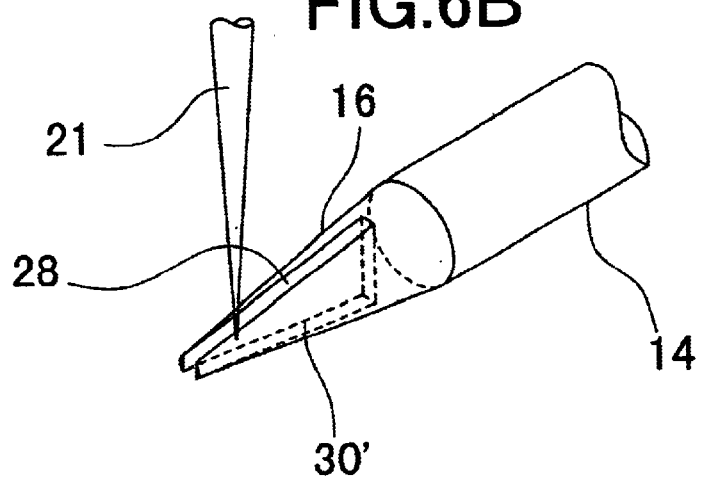
Figure 6C:
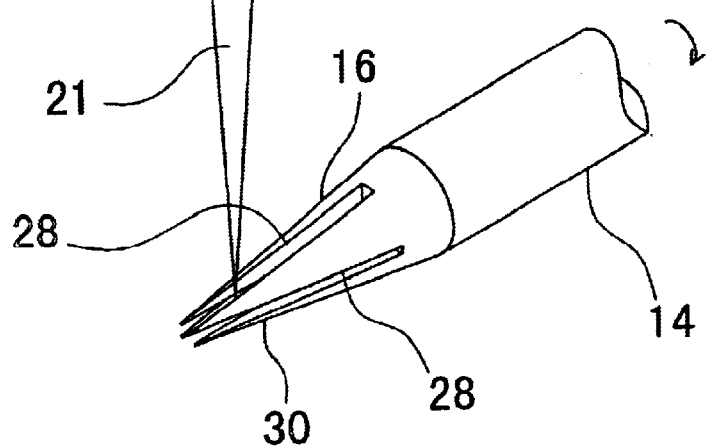

FIGS. 6A to 6C are diagrams for illustrating a method for manufacturing the branch beams split by the slits at the tip of the beam 5. In this example, by taking the case where a beam having the shape shown in FIG. 5 is manufactured as an example, a method for manufacturing the branch beams 30 split and formed by the slits 28 and 29 will be described specifically by using the flow chart of steps shown in FIGS. 6A to 6C.

First, by an electropolishing method or an etching processing method, a tapered shape portion 16 in which the tip is thinner as compared with the root is processed and formed at the tip of the metal beam 14 (FIG. 6A). In this example, a 50 μm-dia tungsten thin needle was used for the metal beam 14, and the tip thereof was subjected to polishing processing by the electropolishing method. In consequence, the tapered shape portion 16 having a tip diameter of about several micrometers or less was processed and formed.

Then, the metal beam 14 having the tapered shape portion 16 was attached to the sample hold system 4 via the holder 8. The sample hold system 4 holding the metal beam 14 of which the tip has been tapered in conical form is mounted in an ion beam processing apparatus as the specimen fabrication equipment described in previous Example 1. Thus, it is aligned and set so that the tip of the tapered shape portion 16 is within the irradiation range of the FIB 21. Subsequently, the FIB 21 is irradiated and scanned to the tip of the tapered shape portion 16. In consequence, first, the slit 28 is formed, so that branch beams 30' split into two units by the slit 28 are formed (FIG. 6B). Namely, at this stage, the branch beams 30' corresponding to the branch beams 18 split into two units shown in FIG. 3B in previous Example 1 is obtained. In short, the slit 28 and the branch beams 30' shown in FIG. 6B correspond to the slit 17 and the branch beams 18 in FIG. 3B, respectively.

Then, the metal beam 14 is rotated 90 degrees by using the rotary system disposed in the sample hold system 4 (not shown). Further, the FIB 21 is irradiated and scanned to form the slit 29. In consequence, the respective two branch beams 30' described above are further individually split into two pieces by the slit 29, so that the branch beams 30 split into a total of four units are obtained (FIG. 6C). Namely, the tapered shape portion 16 is split into four units by the two slits 28 and 29, so that a total of four branch beams 30 can be obtained. Further, if required, the FIB 21 is irradiated and scanned along the outer circumferential portion of each of the branch beams 30, so that the outer circumferential portion of each of the branch beams 30 can be formed in a desired shape. In consequence, it is possible to obtain branch beams 30 having any given desired shape.

By manufacturing the branch beams split by the slits in the tip of the beam by using the foregoing method, it is possible to manufacture minute branch beams relatively easily for a shorter time with high precision. Further, in this example, a description has been given to the method for manufacturing the beam shown in FIG. 5 as the branch beams. However, by forming a plurality of slits with the same method, it is possible to freely manufacture a plurality of branch beams split and formed by a plurality of the slits.

Then, a description will be given to one example of the shape of branch beams split and formed by slits manufactured by using the foregoing method.

Figure 7A:
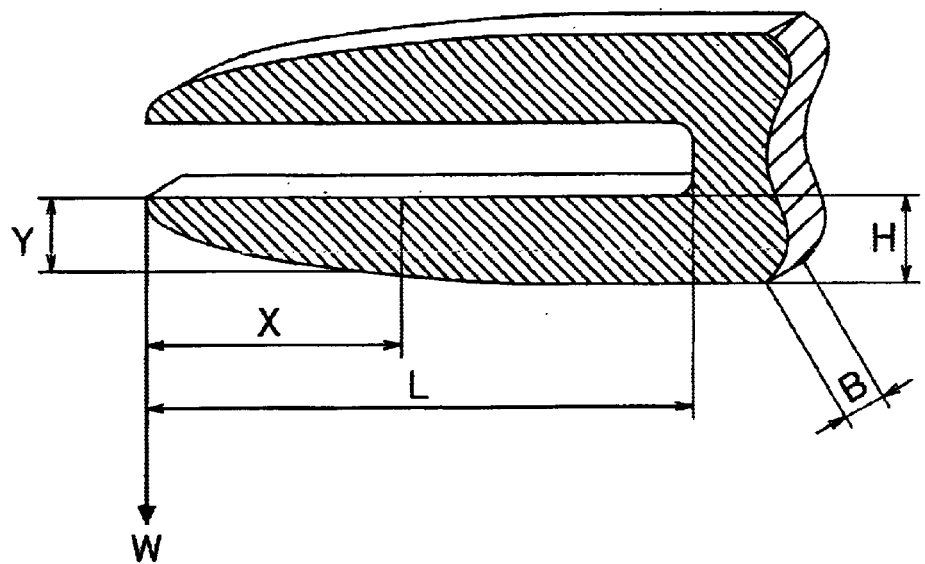
FIGS. 7A and 7B are schematic cross sectional views respectively showing specific configuration examples of the tip of the beam used in the sample hold system portion in the specimen fabrication equipment in accordance with the third example of the present invention.
Figure 7B:
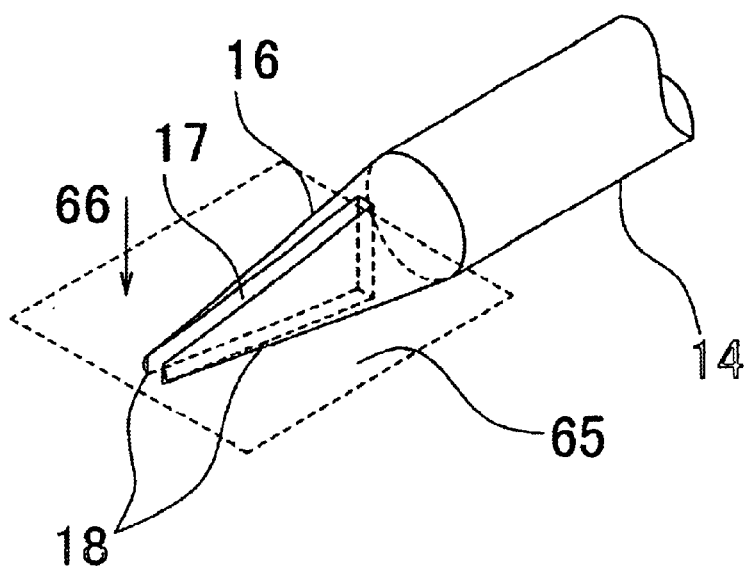

FIG. 7A shows a cross section in schematic form as seen from the direction indicated by an arrow 66 on an assumptive plane 65 indicated by a dotted line in FIG. 7B. In FIG. 7A, a reference character H denotes the height of the root of a branch beam 18, L: the length of the branch beam, B: the width of the branch beam, and Y: the height of the branch beam at a position X in the direction of length of the branch beam from the branch beam tip as a reference. The beam having such a shape that the dimensions denoted by the respective reference characters are determined by the following equations (1) to (3) is referred to as a "uniform strength beam". Specifically, the beam in such a shape that bending stresses occurring on any cross sections of the beam become equal when a load W is applied to the tip of the beam is the "uniform strength beam".

$$Y = (6 \cdot W \times \sigma)^{1/2} \quad (1)$$

$$H = (6 \cdot W \cdot L/B \cdot \sigma)^{1/2} \quad (2)$$

$$V = 8 \cdot W \cdot (L/H)^3 / B \cdot E \quad (3)$$

However, herein, σ denotes the uniform bending stress occurring in the beam, and in this example, it corresponds to 0.2% proof stress of the material constituting the metal beam. Further, V in the equation (3) denotes the amount of displacement of the beam tip, and W in the equations (1) to (3) denotes the load generated at the beam tip when the amount of displacement W has occurred.

The branch beams are manufactured which approximately satisfy the conditions shown in the foregoing equations (1) to (3) so that the bending stresses a generated at the branch beams upon holding of the micro-sample are uniform among respective cross sections of the branch beams, and the a value is not more than 0.2% proof stress of the material constituting the branch beams. This results in the branch beam shape capable of holding the micro-sample with stability repeatedly. The outside shape of such a uniform strength beam is the ideal shape. However, the ones each having an outside shape close to this shape, and, for example, the one having a monotonously increasing curve shape from the tip till the root formed by electropolishing as in FIG. 3D both may also be acceptable. The branch beams manufactured in this example are formed in the following manner. For example, the material for the beam is tungsten. At the tip of the tungsten member, a tapered shape portion of which the outside dimension monotonously increases from the tip till the root is formed by using the electropolishing method. At the tapered shape portion, branch beams split by slits are formed. The height H of the root of the branch beam is 3.3 μm, the length L of the branch beam is 29.5 μm, the width B (approximately corresponding to the size B in the foregoing equation) of the root of the branch beam is 4.4 μm, the length L of the branch beam is 4,4 μm. Thus, the branch beams are configured so that $1.3 \times 10^{-5}$ kg can be obtained as the micro-sample holding force (per branch beam) due to the elastic deformation of the branch beam under the condition that the amount of displacement of the branch beam tip is 0.5 μm.

By using the shape of the branch beam as described above, it is possible to obtain the following effects. First, since the bending stress generated at the branch beams upon holding of the micro-sample is controlled to be not more than 0.2% proof stress of the material constituting the branch beams, plastic deformation does not occur in the branch beams. In consequence, it is possible to obtain long-life branch beams. Secondly, since the micro-sample can be held within the elastically deformed regions of the branch beams, it is possible to hold the micro-sample with stability repeatedly. Thirdly, since designing can be made by predicting the holding force for the micro-sample in advance, it is possible to selectively manufacture the branch beams having a desired configuration according to the characteristics of the micro-sample, and to use it.

EXAMPLE 4

Figure 8:
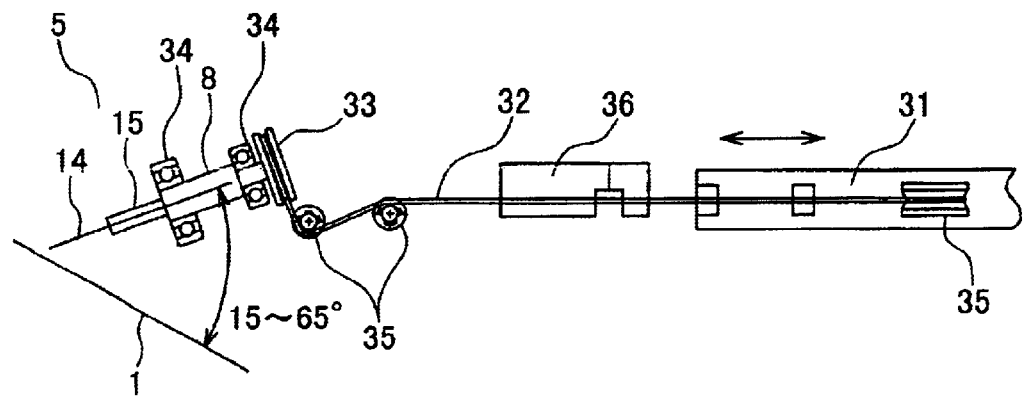
FIG. 8 is a schematic view showing a specific configuration example of a beam rotating system incorporated in a sample hold system portion of a specimen fabrication equipment in accordance with a fourth example of the present invention.

Still other example of the present invention will be described. FIG. 8 shows one example of the configuration of a rotary system for rotating (tilting) the beam 5 attached to the sample hold system 4. A reference numeral 31 in FIG. 8 denotes a drive rod which converts the rotational force of a rotary drive source provided in the rotary drive system 12 (not shown) into a translational force by a feed screw system (not shown), and is caused to undergo translation motion by the translational force. One end of a drive wire 32 is firmly joined to the drive rod 31. The drive wire 32 is a driving force transfer element for transferring the translational force of the drive rod 31 to a pulley 33 disposed at the end of the holder 8 with the beam 5 attached thereon. It converts the translational force of the drive rod 31 into the rotational force via the pulley 33 again, so that the beam 5 is rotated and tilted by the rotational force. The beam 5 is capable of smooth rotary motion via a rolling bearing 34 attached to the holder 8. A reference numeral 35 in the diagram denotes a pulley for correcting the path in order to keep the path for the wire 32. Whereas, a reference numeral 36 is a tension hold system using a leaf spring for holding the tension of the wire 32 at a constant level.

By using the rotary system having the foregoing configuration for rotating and tilting the beam 5, it is possible to obtain the following effects. First, the beam 5 can be attached at a given tilt angle relative to the axis of the sample hold system 4. This permits the beam 5 to be placed at a preferred angle for holding the micro-sample not depending upon the installation angle of the sample hold system 4 to the main equipment (an ion beam processing equipment, or the like as the specimen fabrication equipment). In this example, the tilt angle, between the beam 5 for holding the micro-sample and the micro-sample was set to be 50 degrees. Incidentally, the tilt installation angle of the beam 5 relative to the micro-sample is not limited to 50 degrees as described above, but it can be set to be a given angle preferable for holding and extracting the micro-sample 25 from the top of the specimen substrate 1. Herein, the preferred tilt angle of the beam 5 relative to the micro-sample 25 for holding and extracting the micro-sample 25 is such an angle as to allow the beam 18 to be in contact with only the micro-sample 25 surface without being in contact with the specimen substrate 1 and the ion beam optical system 3. Further, when the micro-sample 25 is held and extracted while being observed by utilizing an SIM image or the like, in addition to the foregoing condition, it is required to be set within such an angle range that the contact portion between the beam 5 and the micro-sample 25 is not at a dead angle upon taking an SIM image. Specifically, the tilt angle varies according to the configuration of other apparatuses such as the ion beam optical system. However, it is desirably set to be a tilt angle in the range of roughly 15 to 65 degrees. Secondly, since the foregoing rotary system is so configured that the wire 32 drives the pulley 33 through a frictional force, the backlash is small. Accordingly, it is possible to transfer the rotational force with reliability, and further, it is possible to keep the detection precision of the amount of rotation of the beam 5 at a high level. In this example, a rotary encoder is used for detecting the amount of rotation, so that 0.1 degree or less is obtained as the rotation amount detection resolving power. Thirdly, in the rotary system, the connection between the beam 5 side and the drive rod 31 side is established by the wire 32. Therefore, the system is less susceptible to the drift due to the temperature change of the system portion downstream of the drive rod 31. In consequence, it is possible to hold the micro-sample with stability. In this example, a drift amount of 0.5 $\mu$m/min or less can be ensured. Further, in this example, a description has been given to the case where the beam 5 is attached with a tilt angle relative to the axis of the sample hold system 4. However, even if the tilt angle is not established, the sample hold system 4 and the beam 5 may be configured coaxially with no problem when the sample hold system 4 itself can be set to be tilted at a tilt angle in the range preferable for the beam 5 to hold and extract the micro-sample.

EXAMPLE 5

Figure 9:
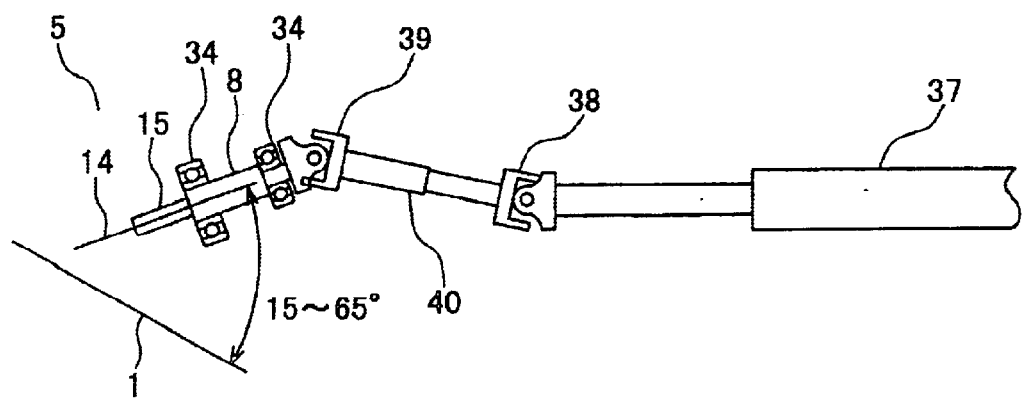
FIG. 9 is a schematic view showing a specific configuration example of a beam rotating system incorporated in a sample hold system portion of a specimen fabrication equipment in accordance with a fifth example of the present invention.
Figure 10H:
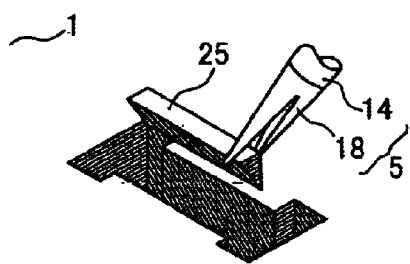
FIGS. 10H, and 10J to 10M are a schematic flow chart of steps for illustrating a specimen fabrication process by using a specimen fabrication equipment in accordance with a sixth example of the present invention.
Figure 10L:
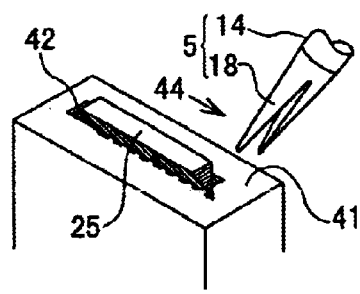
Figure 10J:
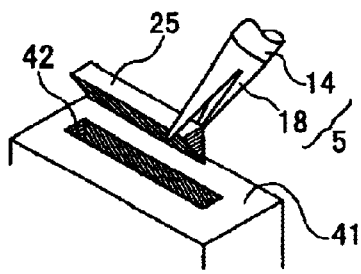
Figure 10M:
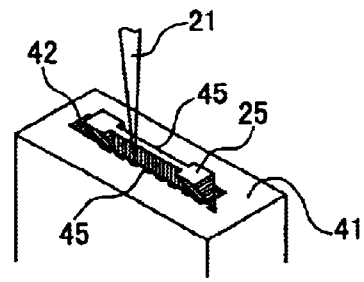
Figure 10K:
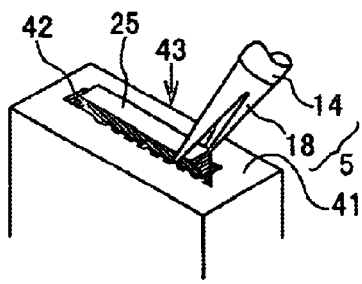

Still other example of the present invention will be described. FIG. 9 is a diagram for illustrating an example of a different configuration from the foregoing configuration of the rotary system for rotating the beam 5 attached to the sample hold system 4. A reference numeral 37 in the diagram denotes a rotary drive rod for transferring the rotational force of the rotary drive source disposed in the rotary drive system 12 (not shown). It rotates the beam 5 firmly joined to the holder 8 via universal couplings 38 and 39. The universal couplings 38 and 39 have no isokinetic property singly. Therefore, in this example, the two universal couplings 38 and 39 are combined to ensure the isokinetic property of the couplings. Further, a reference numeral 40 in the diagram denotes a slider for absorbing variations in length between the universal couplings resulting from the rotation of the universal couplings 38 and 39. By adopting the foregoing configuration for the rotary system, it is possible to obtain the following effects. First, for the same reason as with the rotary system configuration shown in previous Example 4, it is possible to place the beam 5 at a preferred tilt angle relative to the micro-sample portion to be held and extracted. Secondly, the rotary system can transfer the rotational force of the drive source disposed in the rotary drive system 12 to the beam 5 without converting it into other directions of motion. Therefore, the transfer system becomes simplified, so that the rotary system can be implemented cheaply. Thirdly, the rotary system is connected to the beam 5 via the slider 40. Therefore, the system is less susceptible to the drift due to the temperature change of the system downstream of the rotary drive rod 31. In consequence, it becomes possible to hold the micro-sample with stability. Further, in this example, a description has been given to the example where the beam 5 has an angle relative to the axis of the sample hold system 4. However, the sample hold system 4 and the beam 5 may also be configured coaxially with no problem when the sample hold system 4 itself can be set at a preferred angle for the beam 5 to hold the micro-sample.

EXAMPLE 6

A still further example of the present invention will be described. In this example, a description will be given to a method and process for mounting the separated and extracted micro-sample 25 on the sample holder, which are to be carried out in the step H shown in FIG. 4H and the subsequent steps (however, without going through the processing step of the step I) by reference to FIGS. 10H, and 10J to 10M.

Step H (FIG. 10H): In the same manner as in the step H (FIG. 4H) in previous Example 1, the micro-sample 25 separated from the specimen substrate 1 by the previous steps A (FIG. 4A) to G (FIG. 4G) is detached, separated, and extracted from the specimen substrate 1 by operating the sample hold system 4 (not shown) with the transfer system 6 (not shown).

Incidentally, in this Example 6, the process transfers to the next step J without going through the step corresponding to the subsequent step I (FIG. 4I) in previous Example 1.

Step J (FIG. 10J): The micro-sample 25 is transferred onto a sample holder 41 by either or both of the stage 2 (not shown) or the transfer system 6 (not shown). In the sample holder 41, a long vertical trench 42 matched to the micro-sample 25 is previously processed and formed by using an ion beam sputtering method by the FIB 21. Subsequently, the beam 5 is rotated to such an attitude that the micro-sample 25 can be inserted in the long vertical trench 42, so that alignment is performed.

Figure 11:
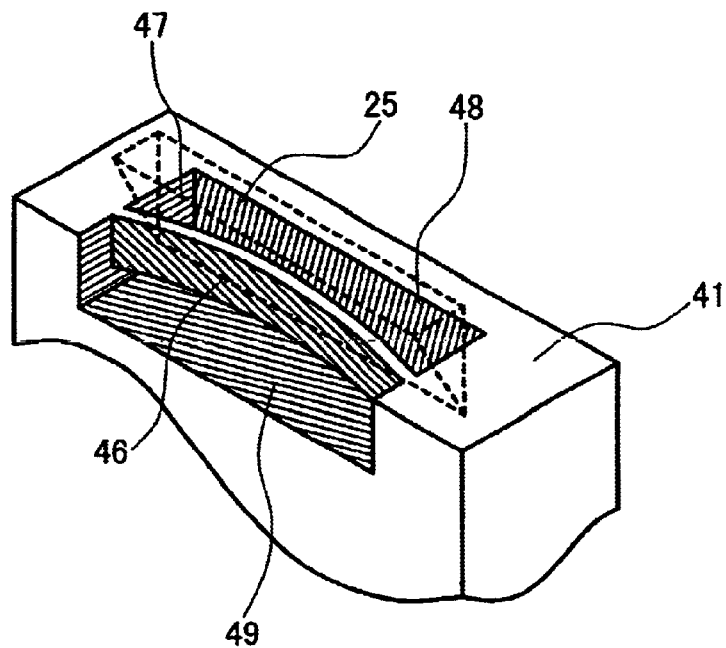
FIG. 11 is a schematic external view for illustrating a specimen fabrication process by using a specimen fabrication equipment in accordance with a seventh example of the present invention.
Figure 12:
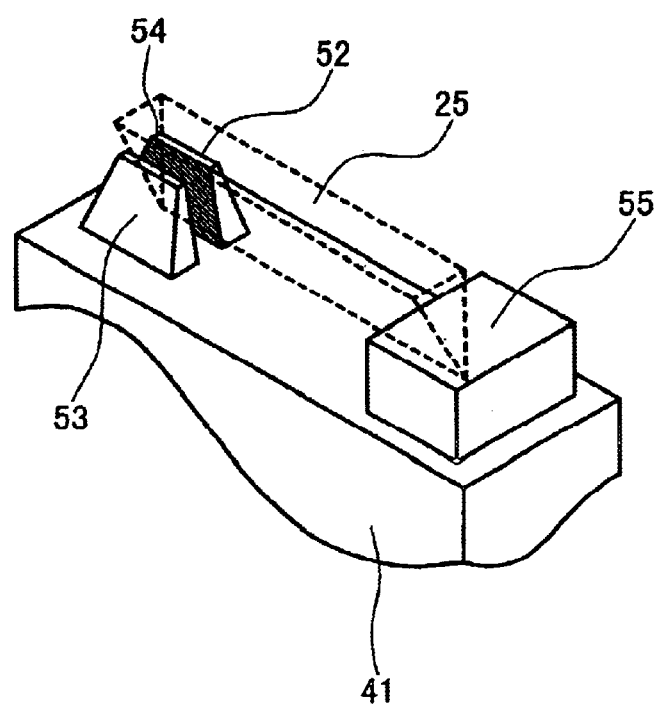
FIG. 12 is a schematic external view for illustrating a specimen fabrication process by using a specimen fabrication equipment in accordance with an eighth example of the present invention.
Figure 13:
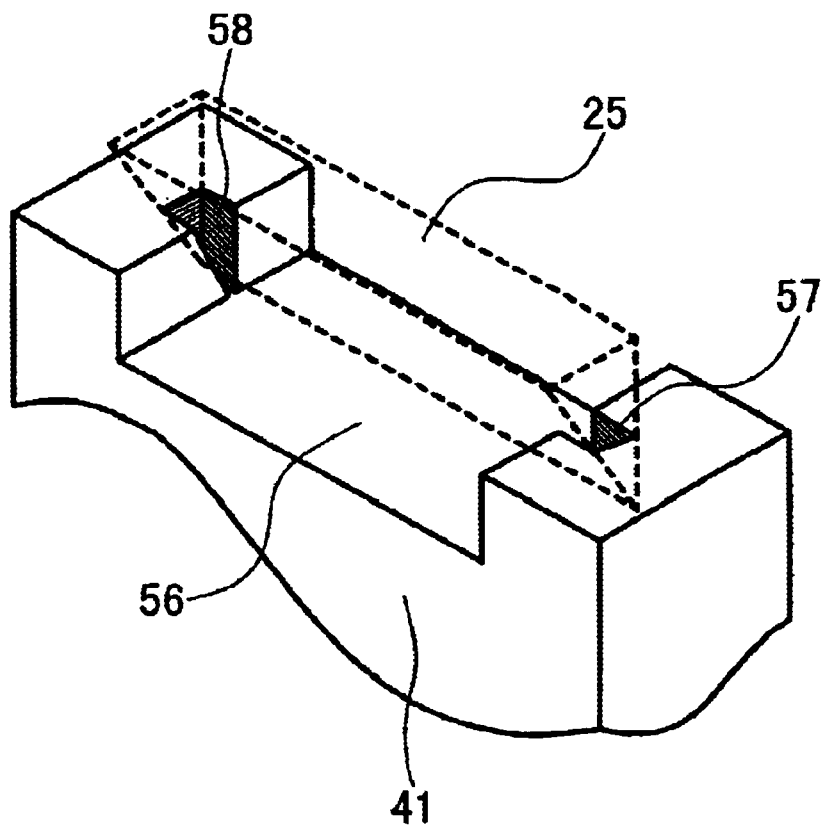
FIG. 13 is a schematic external view for illustrating a specimen fabrication process by using a specimen fabrication equipment in accordance with a ninth example of the present invention.
Figure 14H:
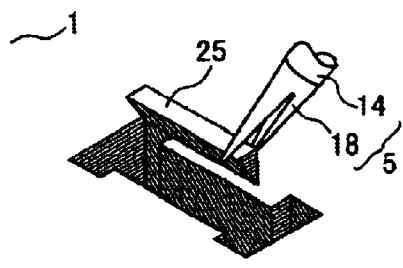
FIGS. 14H, and 14J to 14N are a schematic flow chart of steps for illustrating a specimen fabrication process by using a specimen fabrication equipment in accordance with a tenth example of the present invention.
Figure 14L:
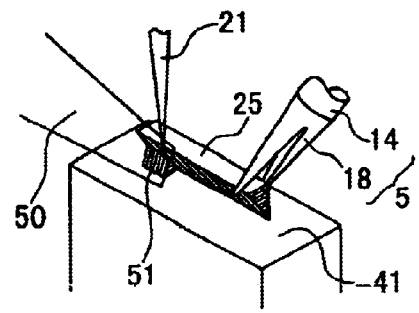
Figure 14J:
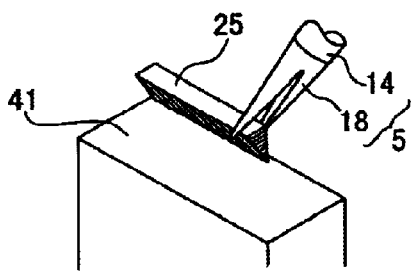
Figure 14M:
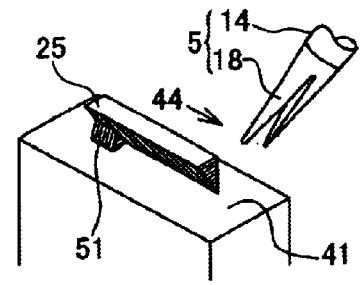
Figure 14K:
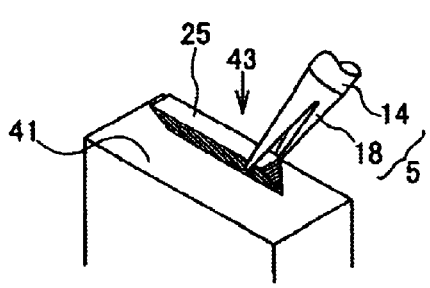
Figure 14N:
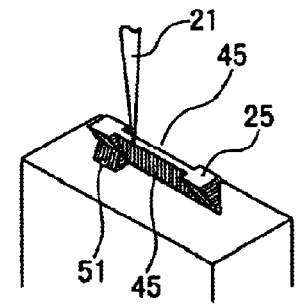

Step K (FIG. 10K): By means of the transfer system 6 (not shown), the beam 5 is transferred in the direction of the sample holder 41 in the manner as indicated by an arrow 43, so that the micro-sample 25 is press-fitted into the long vertical trench 42. The examples of the configuration of the sample holder 41 for holding the micro-sample 25 are shown in FIGS. 11, 12, and 13. As shown in FIGS. 11 to 13, the long vertical trench 42 for press-fitting (insertion) of the micro-sample 25 thereinto is formed in such a shape that the trench width gradually narrows in the direction in which the micro-sample 25 is press-fitted. The micro-sample 25 is pressed into the trench width narrowed portion, thereby to be held therein.

Step L (FIG. 10L): In this step L, the separation (detachment) between the micro-sample 25 firmly held on the sample bolder 41 and the beam 5 tip is performed. Specifically, by moving the sample holder 41 relative to the beam 5, the micro-sample 25 is detached and separated from the beam 5 tip. Incidentally, for preventing the micro-sample 25 from coming out of the long vertical trench 42 with the detachment and transfer of the micro-sample 25 from the beam 5 tip in that step, the sample holder 41 is transferred in the direction (ex., the direction indicated by an arrow 44 in the diagram) different from the direction of transfer of the micro-sample 25 when the micro-sample 25 has been mounted on the sample holder 41 (the direction indicated by the arrow 43). Thus, the separation (detachment) between the beam 5 and the micro-sample 25 is performed.

Step M (FIG. 10M): In this step M, the FIB 21 is irradiated and scanned to the micro-sample 25 firmly held on the sample holder 41, so that trenches 45 are formed on opposite sides of the micro-sample 25. Thus, thinning of the micro-sample 25 is performed. Namely, herein, the same thinning processing as in the step I (FIG. 4I) in previous Example 1 is performed. As a result, it is possible to obtain the micro-sample 25 thinned to a thickness suitable for TEM observation. Further, the thinned micro-sample 25 is taken, together with the sample holder 41, out of the specimen processing equipment. Then, it is charged in the specimen chamber of the TEM apparatus again, so that a desired TEM observation can be carried out.

Incidentally, needless to say, as shown in the step I (FIG. 4I) in previous Example 1, the step M (FIG. 4M) in this example may also be carried out prior to fixing the micro-sample 25 onto the sample holder 41.

By adopting the forgoing method in accordance with this example, it is possible to obtain the following effects.

First, in the method for mounting the micro-sample in accordance with this example, a technology of firmly joining the tip of the beam 5 onto the micro-sample 25 to be extracted, by formation of an ion beam assisted deposition film is not used for separating and extracting the micro-sample 25 from the specimen substrate 1 as in the prior-art technology. Therefore, contamination will not be inflicted on the specimen substrate 1 and the micro-sample 25. Similarly, also when the separated and extracted micro-sample 25 is mounted (firmly held) on the sample holder 41, a technology of firmly joining the micro-sample 25 on the sample holder 41 by formation of an ion beam assisted deposition film is not used. Accordingly, contamination will not be inflicted on the specimen substrate 1, the micro-sample 25, and the like, either. For this reason, even when the sample holder 41 is placed in the same vacuum chamber as that for the specimen substrate 1, and further placed in proximity to the specimen substrate 1, contamination will not be inflicted on the specimen substrate 41, the micro-sample 25, and the like, either.

Secondly, in this example, for all the means for separating and extracting the micro-sample 25 from the specimen substrate 1, and firmly holding it on the sample holder 41, a means utilizing a physical force is used. Thus, a means utilizing a chemical reaction in the formation of an ion beam assisted deposition film, or the like is not used as in the prior-art technology. Therefore, almost no contamination will be inflicted on the periphery of the equipment. Further, it is possible to extract and mount the micro-sample without bringing the ones causing contamination into the equipment at all. Therefore, the inside space of the equipment itself will not be contaminated, either.

Thirdly, in the sample mounting method in accordance with this example, a specimen for TEM observation can be fabricated by a very simple method of merely inserting and fixing the micro-sample into the trench disposed on the sample holder. Therefore, it is possible to obtain a specimen for TEM observation with ease and for a shorter time.

EXAMPLE 7

A more further example of the present invention will be described. FIG. 11 shows another example of the configuration of the sample holder used in previous Example 6. A reference numeral 46 in the diagram denotes a leaf spring for holding the micro-sample. It is manufactured by processing trenches 47 and 49 in the sample holder 41 by using a processing means based on an ion beam sputtering method, or the like. The leaf spring 46 is a leaf spring having a curved shape with a thickness of 1 to 3 $\mu$m and a height of about 5 $\mu$m. The opposite ends thereof are connected to the sample holder 41. When the micro-sample 25 held by the beam 5 by the foregoing method is inserted into the long vertical trench 47, the micro-sample 25 comes in contact with the leaf spring 46 and the side wall 48 of the trench 47 opposing thereto. At this step, the micro-sample 25 is pressed against the side wall 48 of the trench 47 by the pressing force generated by the elastic deformation of the leaf spring 46. In consequence, it is firmly held on the sample holder 41 with reliability.

EXAMPLE 8

A still further example of the present invention will be described. FIG. 12 shows still other example of the configuration of the sample holder for mounting the micro-sample used in previous Example 6. Reference numerals 52 and 53 in the diagram denote holders for holding the micro-sample 25 (indicated by a dotted line in the diagram) mounted on the sample holder 41 by the elastic deformation thereof. The micro-sample 25 is held by being inserted into a gap 54 having a narrower gap width than the width of the micro-sample 25, formed between the holders 52 and 53 by the foregoing method. The insertion of the micro-sample 25 into the gap 54 causes the holders 52 and 53 to elastically deform. As a result, a holding force for holding the micro-sample 25 can be obtained. Incidentally, FIG. 12 shows the case where holders formed in symmetric shape across the gap 54 are used as the holders 52 and 54. However, even when these two holders have mutually different shapes, and hence the holding forces resulting from their respective elastic deformations are different from each other, it is possible to obtain the same holding effects as described above. Further, such a configuration is also acceptable that one of the holders will not undergo elastic deformation, and hence the micro-sample is held by only the holding force due to the elastic deformation of the other holder.

A reference numeral 55 in the diagram denotes a stopper block disposed on the sample holder 41. For separating (detaching) the beam 5 (not shown) holding the micro-sample 25 from the micro-sample 25 inserted and held in the gap 54 between the holders 52 and 53, the beam 5 is transferred in the direction of the stopper block 55, thereby to be separated (detached) from the micro-sample 25. By doing so, one end of the micro-sample 25 which attempts to come out of the gap 54 with transfer (detachment) of the beam 5 is allowed to abut on the stopper block 55. As a result, it is possible to prevent the micro-sample 25 from coming out of the inside of the gap 54. In other words, the stopper block 55 plays a role of a stopper for preventing the micro-sample 25 from coming out of the inside of the gap 54.

Use of the sample holder having the foregoing configuration in this example allows the micro-sample 25 to be mounted in such a state that opposite sides of the micro-sample 25 to be objects of observation, processing, or the like will not be hidden in the shadows of the components of the sample holder 41. In consequence, in addition to the effects obtained by the previously shown sample holder configuration, it is also possible to further obtain the following effects. First, it is possible to carry out the thinning processing of the micro-sample shown in the step M (FIG. 10M) in previous Example 6 over the entire region in the direction of height of the micro-sample. Secondly, when the micro-sample subjected to thinning processing is used as the micro-sample for TEM observation, it is possible to ensure a wider observation region as compared with the case of the foregoing sample holder configuration. Thirdly, since it is possible to mount a micro-sample with a small height size with reliability, it is possible to respond to a request for the holding of a more minute micro-sample. Fourthly, since it is possible to mount a micro-sample with a small height size, the height size of the micro-sample to be separated and extracted from the specimen substrate may be small. As a result, the processing time for separation and extraction can be shortened, so that it is possible to improve the efficiency of micro-sample fabrication. Incidentally, in this example, the holders 52 and 53 and the stopper block 55 disposed on the sample holder 41 were fabricated by an ion beam sputtering method. However, these are not necessarily required to be fabricated by the ion beam sputtering method. It can also be fabricated by an etching method, or a lithographic method so long as the foregoing conditions are satisfied.

EXAMPLE 9

A still other example of the present invention will be described. FIG. 13 shows still further example of the sample holder for holding the micro-sample used in previous Example 6. A reference numeral 56 in the diagram denotes a trench disposed on the sample holder 41. In the stopper blocks one on each opposite end side of the trench, wedge trenches 57 and 58 for insertion and holding of the micro-sample 25 (indicated by a dotted line in the diagram) are provided. In this example, a sample holder in which the trench 56 has been previously formed by an etching processing method was prepared. Then, the wedge trenches 57 and 58 were processed and formed by an ion beam sputtering method so as to fit the width size of the micro-sample to be mounted. As a result, a sample holder having the foregoing configuration was manufactured. With the foregoing method, the micro-sample 25 is mounted on the sample holder in such a manner that the opposite ends thereof are respectively inserted into the wedge trenches 57 and 58. For the separation between the micro-sample 25 and the beam 5 (not shown) holding it, the beam 5 is transferred in any one of the directions of the wedge trenches 57 and 58. As a result, the micro-sample 25 is restricted as to the movement in the direction of transfer of the beam 5 by the wedge trenches 57 and 58. Therefore, it will not be detached from the top of the sample holder 41, and mounted with reliability and stability. Use of the sample holder having the foregoing configuration allows the micro-sample 25 to be mounted in such a state that opposite sides of the micro-sample 25 used for observation, processing, or the like will not be hidden in the shadows of the components of the sample holder 41. In consequence, it is possible to obtain the same effects as described in previous Example 8.

EXAMPLE 10

A still more further example of the present invention will be described. In this example, a description will be given to a still other method and process for mounting the separated and extracted micro-sample 25 on the sample holder 41, which are to be carried out in the step H (FIG. 4H) and the subsequent steps in previous Example 1 by reference to FIGS. 14H, and 14J to 14N.

Step H (FIG. 14H): Since this step is the same as the step H (FIG. 4H) in previous Example 1, a specific explanation herein is omitted. Incidentally, if required, see the explanation on the step H (FIG. 4H) in previous Example 1.

Figure 4A:
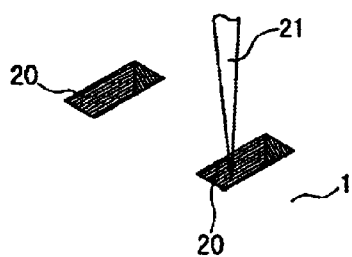
FIGS. 4A to 4I are a flow chart of steps for illustrating a specimen fabrication process by using the specimen fabrication equipment in accordance with the first example of the present invention shown in FIG. 1.
Figure 4F:
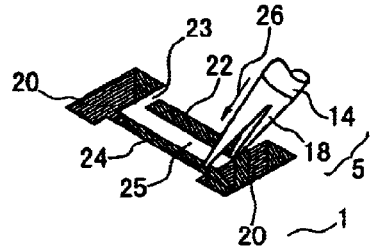
Figure 4B:
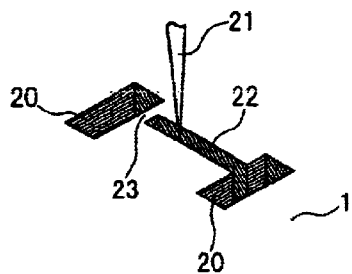
Figure 4G:
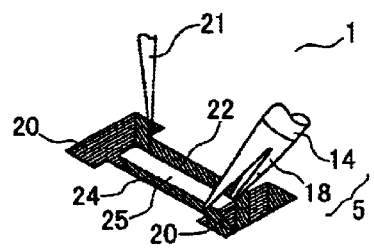
Figure 4C:
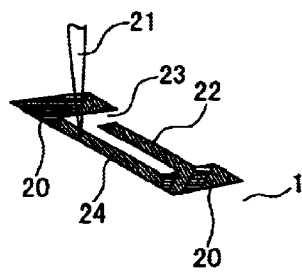
Figure 4H:
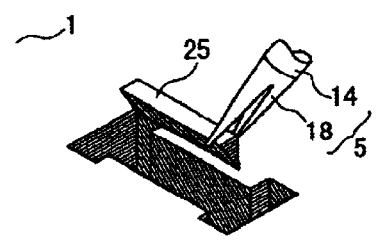
Figure 4D:
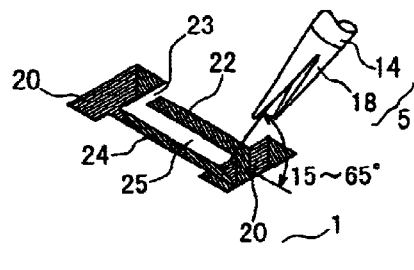
Figure 4I:
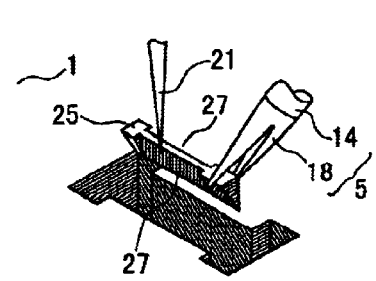
Figure 4E:
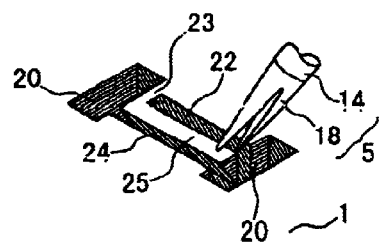

Further, in previous Example 1, the step I shown in FIG. 4I was carried out after the step H. However, in this example, the process transfers to the next step J without carrying out the step corresponding to the step I.

Step J (FIG. 14J): The extracted micro-sample 25 is transferred onto the sample holder 41 by operating either or both of the stage 2 (not shown) and the transfer system 6 (not shown).

Step K (FIG. 14K): By means of the transfer system 6 (not shown), the beam 5 is transferred in the direction of the sample holder 41 indicated by an arrow 43, so that the micro-sample 25 is brought in contact with the top of the sample holder. Detection of the contact between the micro-sample 25 and the sample holder 41 is accomplished in the following manner. Namely, the beam 5 is previously applied with a given voltage via the sample hold system 4 (not shown). The change in the applied voltage is detected through the micro-sample 25. In consequence, the presence or absence of contact between the micro-sample 25 and the sample holder 41 is detected.

Step L (FIG. 14L): While supplying a deposition gas 50 for forming an ion beam assisted deposition film to the contact portion between the micro-sample 25 and the sample holder 41, the FIB 21 is irradiated and scanned to the supplied deposition gas 50. As a result, an ion beam assisted deposition film 51 is deposited and formed on the contact portion between the micro-sample 25 and the sample holder 41. Thus, a firm connection therebetween is established through this film.

Step M (FIG. 14M): The beam 5 is transferred in the direction indicated by an arrow 44 in the diagram in such a manner that the ion beam assisted deposition film deposited and formed in the step L is prevented from being broken. Thus, the separation (detachment) between the beam 5 and the micro-sample 25 is performed.

Step N (FIG. 14N): The FIB 21 is irradiated and scanned to the micro-sample 25 firmly joined onto the sample holder 41, so that trenches 45 are formed on opposite sides of the micro-sample 25. By formation of the trenches 45, thinning processing of the micro-sample 25 is accomplished. As a result, it is possible to obtain the micro-sample for TEM observation. Further, the thinned micro-sample 25 is taken out, together with the sample holder 41, to be charged in the TEM apparatus. In consequence, it is possible to carry out a TEM observation immediately. Incidentally, needless to say, the step N in this example may also be carried out prior to firmly holding the extracted micro-sample 25, onto the sample holder 41 as with the step I (FIG. 4I) in previous Example 1.

Further, in this example, a description has been given to the case where the sample holder 41 in which a trench or the like for insertion and fixing of the micro-sample 25 is not provided is used as an example. However, by providing a trench for inserting and fixing the micro-sample onto the sample holder 41, a stopper block for preventing the micro-sample from being separated from the top of the sample holder 41, and the like, it is also possible to firmly join the micro-sample 25 thereto with more stability.

By adopting the method for mounting the extracted micro-sample 25 on the sample holder 41 in accordance with this example, it is possible to obtain the following excellent effects. First, it is not required to perform a specific pre-processing such as formation of a trench for insertion of the micro-sample on the sample holder in advance in order to firmly join the extracted micro-sample onto the sample holder. In consequence, it is possible to directly mount the micro-sample on the sample holder in any given shape. Secondly, by using an ion beam assisted deposition film for firmly joining the micro-sample onto the sample holder, it is possible to obtain a high connection strength therebetween. Therefore, it is possible to detach and separate the beam from the micro-sample after being firmly joined onto the sample holder with reliability and stability. Further, handling of the sample holder with the micro-sample held thereon is facilitated. Thirdly, any shape of the sample holder is acceptable, and the sample holder in any given shape can be used. Therefore, it is possible to supply the sample holder cheaply. Further, it becomes possible to install it in a given observation, measurement, or processing apparatus such as a TEM apparatus with ease.

EXAMPLE 11

Figure 15H:
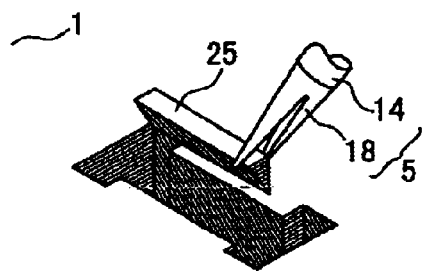
FIGS. 15H, 15O, and 15P are a schematic flow chart of steps for illustrating a specimen fabrication process by using a specimen fabrication equipment in accordance with an eleventh example of the present invention.
Figure 15O:
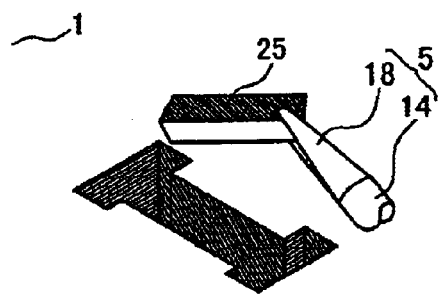
Figure 15P:
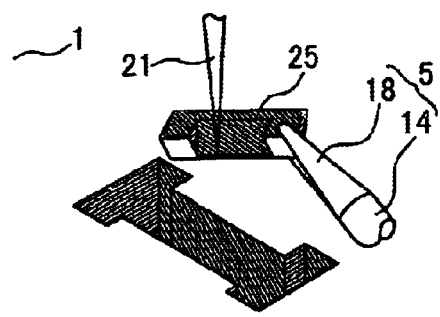

A still further example of the present invention will be described. In this example, a description will be given to a method and a process for performing a multilateral observation, measurement, and processing of the separated and extracted micro-sample 25 being held, which are to be carried out in the step H (FIG. 4H) and the subsequent steps in previous Example 1 by reference to FIGS. 15H, 15O, and 15P.

Step H (FIG. 15H): Since this step is the same as the step H (FIG. 4H) in previous Example 1, a specific explanation herein is omitted. Incidentally, if required, see the explanation on the step H (FIG. 4H) in previous Example 1.

Step O (FIG. 15O): The micro-sample 25 separated and extracted from the specimen substrate 1 is controlled in attitude to an any given angle by rotating the beam 5. For observation of the micro-sample in this state, for example, an SIM image can be used. However, if required, by using a micrograph obtained by using, for example, an electron beam, having a higher observation resolving power, it is also possible to perform an observation with a higher resolving power than with the SIM image. Further, needless to say, it is also possible to observe the micro-sample 25 while rotating it. Still further, for observation by means of an electron beam or the like, it is not necessarily required to fabricate the micro-sample being mounted on the sample holder (not shown) by using the specimen fabrication (processing) method and equipment in accordance with the present invention as described in Example 1. Thus, the micro-sample being held by the sample hold system (beam) 5 may also be mounted again into the specimen chamber of an observation and analysis apparatus such as a scanning electron microscope (SEM) as it is (together with the hold system 5) to carry out a desired observation and analysis.

Step P (FIG. 15P): The FIB 21 is irradiated and scanned to the micro-sample 25 controlled in attitude to an any given angle of rotation by using a beam rotating system (not shown). Thus, an any given surface of the micro-sample 25 is further subjected to cutting processing by using an ion beam sputtering method. As a result, multilateral cutting processing of the micro-sample 25 can be performed, and hence it is possible to manufacture a micro-sample having a shape with a higher degree of freedom. Further, in this step, by capturing secondary ions and neutral particles generated during the ion beam sputtering processing, it is also possible to perform the analysis of the micro-sample 25. Still further, as with the foregoing step O (FIG. 15O), in this step, it is not necessarily required to fabricate the micro-sample for observation by using the specimen fabrication (processing) method and equipment in accordance with the present invention as described in Example 1. Needless to say, it is also acceptable that the micro-sample being held by the sample hold system (beam) 5 is mounted again as it is (together with the hold system 5) in the specimen chamber of an observation and analysis apparatus such as a secondary ion analysis apparatus to carry out a desired analysis.

In this example, a description has been given to the case where the steps O and P are carried out continuously. However, these steps O and P are not necessarily required to be carried out continuously. Even if the respective steps are carried out singly, there is no problem at all.

EXAMPLE 12

A still other example of the present invention will be described. In this example, a description will be given to a still other method and a process for separating and extracting the micro-sample 25 from the specimen substrate 1 by reference to FIGS. 16Z, and 16A to 16C, and 16E to 16H.

Step Z (FIG. 16Z): In this example, the fabrication of the beam 5 is performed in this step Z (FIG. 16Z) by using the FIB 21 in the same apparatus as the apparatus for separating and extracting the micro-sample from the specimen substrate with the same method as the method described in previous Example 3 (FIGS. 6A to 6C).

Step A (FIG. 16A) to step C (FIG. 16C): The step A (FIG. 16A) to step C (FIG. 16C) to be carried out subsequently to the step Z are the same steps as the step A (FIG. 4A) to step C (FIG. 4C) shown in previous Example 1. In these steps A to C, trench processing for separating and extracting the micro-sample 25 is performed.

Figure 16Z:
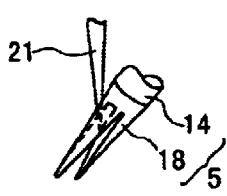
FIGS. 16Z, 16A, 16B, 16C, 16E, 16F, 16G, and 16H are a schematic flow chart of steps for illustrating a specimen fabrication process by using a specimen fabrication equipment in accordance with a twelfth example of the present invention.
Figure 16A:
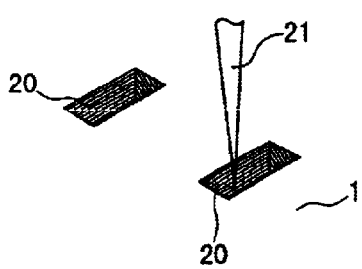
Figure 16B:
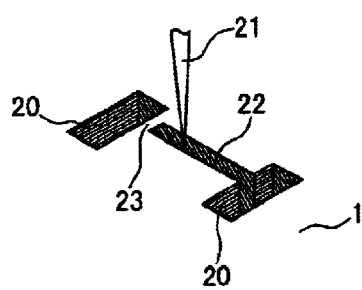
Figure 16C:
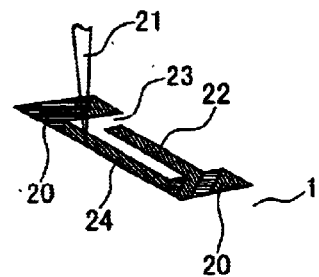
Figure 16E:
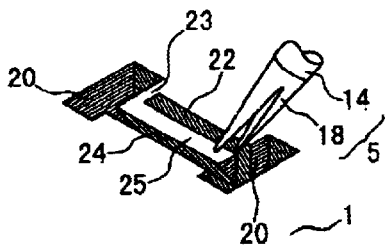
Figure 16F:
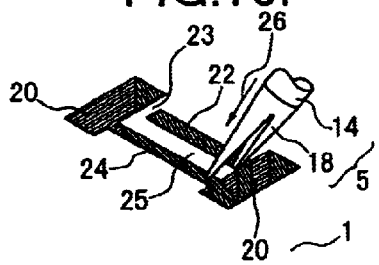
Figure 16G:
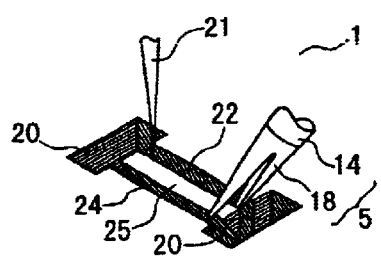
Figure 16H:
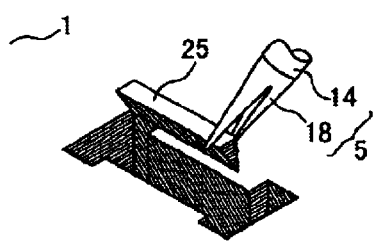
Figure 17H:
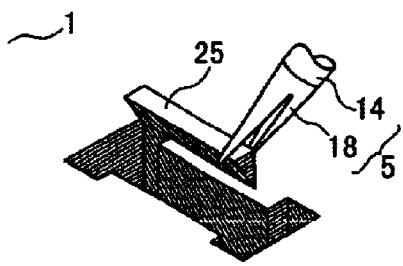
FIGS. 17H, 17J, 17K, 17X, and 17Y are a schematic flow chart of steps for illustrating a specimen fabrication process by using a specimen fabrication equipment in accordance with a thirteenth example of the present invention.
Figure 17X:
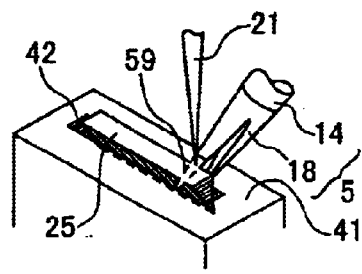
Figure 17J:
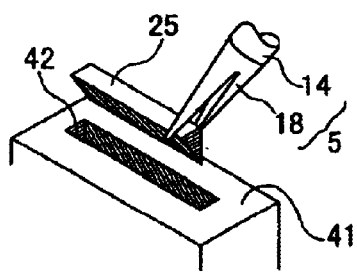
Figure 17Y:
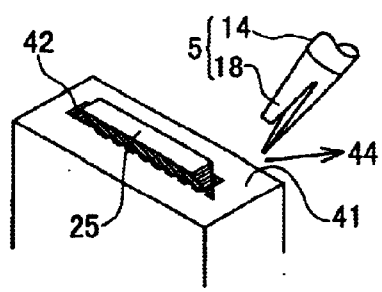
Figure 17K:
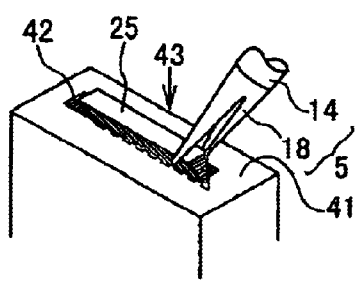
Figure 18Q:
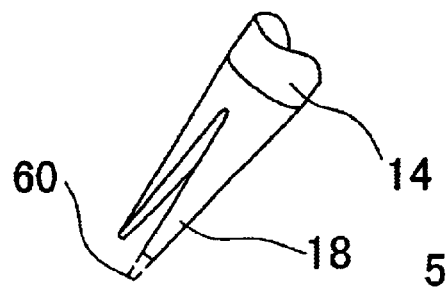
FIGS. 18Q to 18T are a schematic flow chart of steps showing one example of a method for restoring the tip of a beam used in a sample hold system portion of a specimen fabrication equipment in accordance with a fourteenth example of the present invention.
Figure 18R:
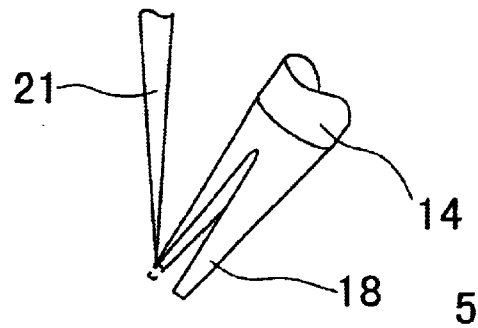
Figure 18S:
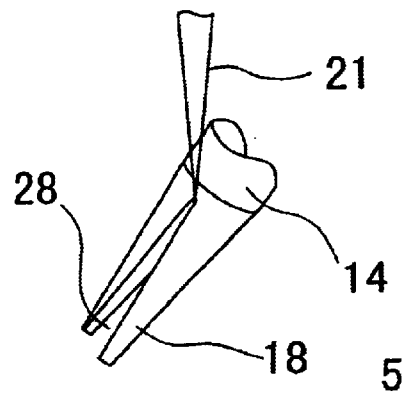
Figure 18T:
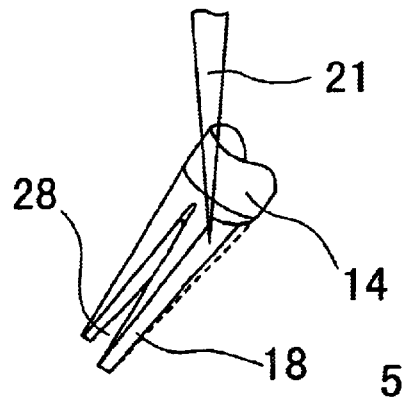

Incidentally, in previous Example 1, subsequently to the step C (FIG. 4C), the step D (FIG. 4D) for controlling the attitude of the beam 5 to a preferred attitude for holding the micro-sample 25 was carried out. However, in this example, the step A (FIG. 16A) to step C (FIG. 16C) are carried out subsequently to the step Z (FIG. 16Z). Therefore, in these step A (FIG. 16A) to step C (FIG. 16C), the beam 5 is inevitably kept in preferred attitude for holding the micro-sample 25. Accordingly, another attitude control at this step is unnecessary, and hence, the next steps E to H are carried out immediately.

Step E (FIG. 16E) to step H (FIG. 16H): The step E (FIG. 16E) to step H (FIG. 16H) in this example are the same steps as the step E (FIG. 4E) to step H (FIG. 4H) in previous Example 1. In accordance with these steps E to H, the micro-sample 25 is separated and extracted from the specimen substrate 1.

The foregoing method and steps eliminate the necessity of carrying out the step of controlling the attitude of the beam 5 for holding the micro-sample 25. This produces an effect of shortening the step for separating and extracting the micro-sample 25 from the top of the specimen substrate 1. Further, the beam 5 is not required to be controlled in attitude. Therefore, the rotary system (not shown) for rotating the beam 5 disposed in the sample hold system (not shown) also becomes unnecessary. This produces an effect of simplifying the configuration of the entire system.

EXAMPLE 13

A still more further example of the present invention will be described. In this example, a description will be given to a method and process for mounting the micro-sample 25 separated and extracted from the specimen substrate 1 on the sample holder 41, which are to be carried out in the step H (FIG. 4H) and the subsequent steps in previous Example 1 by reference to FIGS. 17H, 17J to 17K, and 17X to 17Y.

Step H (FIG. 17H): Since the step H (FIG. 17H) in this example is the same as the step H (FIG. 4H) in previous Example 1, a specific explanation herein is omitted.

Step J (FIG. 17J) to step K (FIG. 17K): Since the step J (FIG. 17J) to step K (FIG. 17K) in this example are the same as the step J (FIG. 10J) to step K (FIG. 10K) in previous Example 6, a specific explanation herein is omitted. However, in this example, the process transfers to the following steps X to Y immediately subsequent to the step K, without carrying out the subsequent steps L to M in previous Example 6.

Step X (FIG. 17X): With the micro-sample 25 inserted and held in the trench 42 disposed on the sample holder 41 in the step K, the FIB 21 is irradiated and scanned to one of the two branch beams 18 split and formed by the slit in the beam 5 tip. As a result, the part 59 of the one branch beam 18 in contact with the micro-sample 25 is removed (cut). By the removal (cutting) of the part 59 of the one branch beam 18 in contact with the micro-sample 25, the beam 5 is separated (detached) from the micro-sample 25.

Step Y (FIG. 17Y): The beam 5 is transferred in the direction indicated by an arrow 44, so that the beam 5 is withdrawn from the micro-sample 25 and the top of the sample holder 41.

With the foregoing method for mounting the micro-sample 25 on the sample holder 41 in accordance with this example, in the step X, the beam 5 and the micro-sample 25 are separated (detached) from each other by cutting the contact portion therebetween through FIB 21 irradiation. This produces the following effect. Namely, for separation (detachment) between the micro-sample 25 and the beam 5, a physical stress will not be applied to the micro-sample 25. Further, in the subsequent step Y, the beam 5 has already been separated from the micro-sample 25, and hence the direction in which the beam 5 should be withdrawn has no restriction. Thus, it is also possible to transfer the beam 5 back to the opposite direction from the direction of transfer of the beam 5 when the micro-sample 25 has been mounted on the sample holder 41 for withdrawal.

EXAMPLE 14

Still more further example of the present invention will be described. In this example, a description will be given to a method for restoring the damaged beam 5 and the steps therefor in the case where a part of the beam 5 has been damaged by reference to FIGS. 18Q to 18T. Incidentally, herein, a description will be given to the case where a part of the branch beams 18 split and formed by the slit at the tip of the beam 5 is damaged as an example of the damage of the beam 5.

Step Q (FIG. 18Q): The beam 5 having a loss part 60 (indicated by a dotted line) in the branch beam 18 provided at the tip of the beam 5 is transferred into the FIB irradiatable range.

Step R (FIG. 18R): The branch beam having no lass part out of the two branch beams 18 at the beam 5 tip is partially removed through irradiation and scanning of the FIB 21 so that it becomes equal in length to the branch beam having the loss part 60. As a result, it is possible to roughly equalize the lengths of both the branch beams 18.

Step S (FIG. 18S): The FIB 21 is irradiated and scanned to the end on the root side of the slit 28 already processed and formed at the tip of the beam 5, so that the slit 28 is processed again so as to have a desired geometry.

Step T (FIG. 18T): The FIB 21 is irradiated and scanned to the outer circumferential portion of the branch beams 18. Thus, the outer circumferential portion of the branch beams 18 is subjected to shaping processing so as to have a desired geometry. For the shaping processing, it is also possible to perform the shaping processing by rotating (or while rotating) the beam 5 so as to obtain a desired FIB irradiation orientation by using the rotary system (not shown) for rotating the beam 5 disposed in the sample hold system 4 (not shown).

By using the foregoing method for restoring the beam tip in accordance with this example, even when a part of the beam 5 is damaged (lost) due to some cause, it becomes possible to restore the damaged (loss) part, and return the damaged beam 5 to the continuously usable beam 5. Incidentally, as the factors causing the damage (loss) of the beam 5, for example, mention may be made of the misalignment for FIB irradiation when the method for mounting the micro-sample 25 by using the FIB irradiation method as described in previous Example 13 is adopted, or similarly when the beam 5 is fabricated by using the FIB irradiation method, and further the collision between the beam 5 and the micro-sample 25 when the micro-sample 25 is held by the beam 5.

In this example, a description has been given to the example in which the foregoing steps R to T are carried out continuously in succession. However, even if the order in which the steps R to T are carried out is changed, the obtainable effects remain the same. Further, all of these steps R to T are not required to be carried out according to the degree of the damage (loss) of the damaged (loss) part. Needless to say, if required, only any one step of these steps R to T may be carried out, or a given plurality of the steps may be used in combination in a given order.

EXAMPLE 15

Figure 19Q:
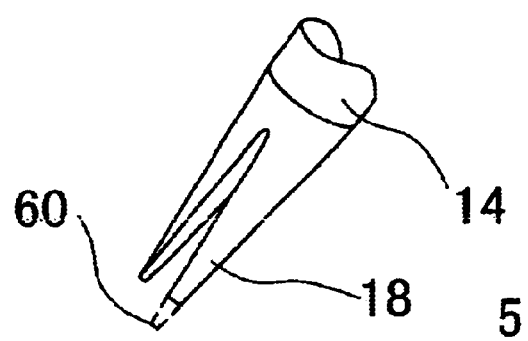
FIGS. 19Q and 19U are a schematic flow chart of steps showing one example of a method for restoring the tip of a beam used in a sample hold system portion of a specimen fabrication equipment in accordance with a fifteenth example of the present invention.
Figure 19U:
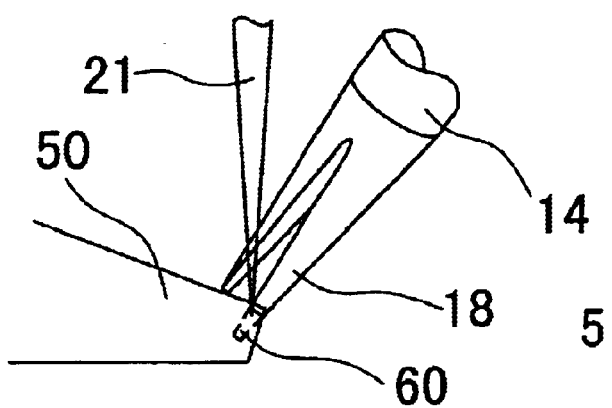

The present invention will be described by way of a more further example. This example pertains to a method, different from the foregoing, for restoring and reconstructing the beam 5 when a part of the beam 5 has been damaged (lost). It will be described by reference to a flow chart of steps of the FIGS. 19Q and 19U.

Step Q (FIG. 19Q): This step Q (FIG. 19Q) in this Example 15 is the same step as the step Q (FIG. 18Q) shown in previous Example 14. Also in this example, as with previous Example 14, a description will be given to the case where a part (tip) 60 of one of the two branch beams 18 disposed at the tip of the beam 5 is lost as an example of the damaged beam 5. In the step Q (FIG. 18Q), the loss part 60 is transferred into the region capable of undergoing irradiation with the FIB for restoring processing.

Step U (FIG. 19U): A deposition gas 50 for forming an ion beam assisted deposition film is supplied to the vicinity of the loss part 60 of the beam 5 transferred and set in the FIB irradiatable region in accordance with the step Q. By irradiating and scanning the FIB 21 to the deposition gas supplied portion, the ion beam assisted deposition film is formed at the loss part 60 of the branch beam 18. By repeating this step, the ion beam assisted deposition film is deposited and grown at the loss part 60 of the branch beam 18. Thus, by making up the loss part 60 of the branch beam 18, the loss part 60 is restored and reconstructed.

By adopting the foregoing method for restoring and reconstructing the damaged (loss) part of the beam 5 in accordance with this example, even when a part of the beam 5 has been damaged (lost) by some causes, it is possible to restore and reconstruct the beam 5 into a required geometry, and render it continuously usable.

Further, after the foregoing step U, it is possible to subject the part made up by the ion beam assisted deposition film to shaping processing into a required geometry by using the steps R to T described in previous Example 14. In this example, by using tungsten as the material for the beam 5, and using a tungsten gas as the deposition gas 50 for forming the ion beam assisted deposition film, the damaged (lost) part was restored. However, the material for the beam 5 is not necessarily required to be identical in type to the composition of the deposition gas 50 for forming the ion beam assisted deposition film. There is no problem so long as the ion beam assisted deposition film can be formed by irradiation with the FIB 21.

EXAMPLE 16

A still other example of the present invention will be described. In this example, a description will be given to a different example of the configuration from the foregoing, of a specimen fabrication equipment capable of separation and extraction of the micro-sample by reference to FIG. 20.

Figure 20:
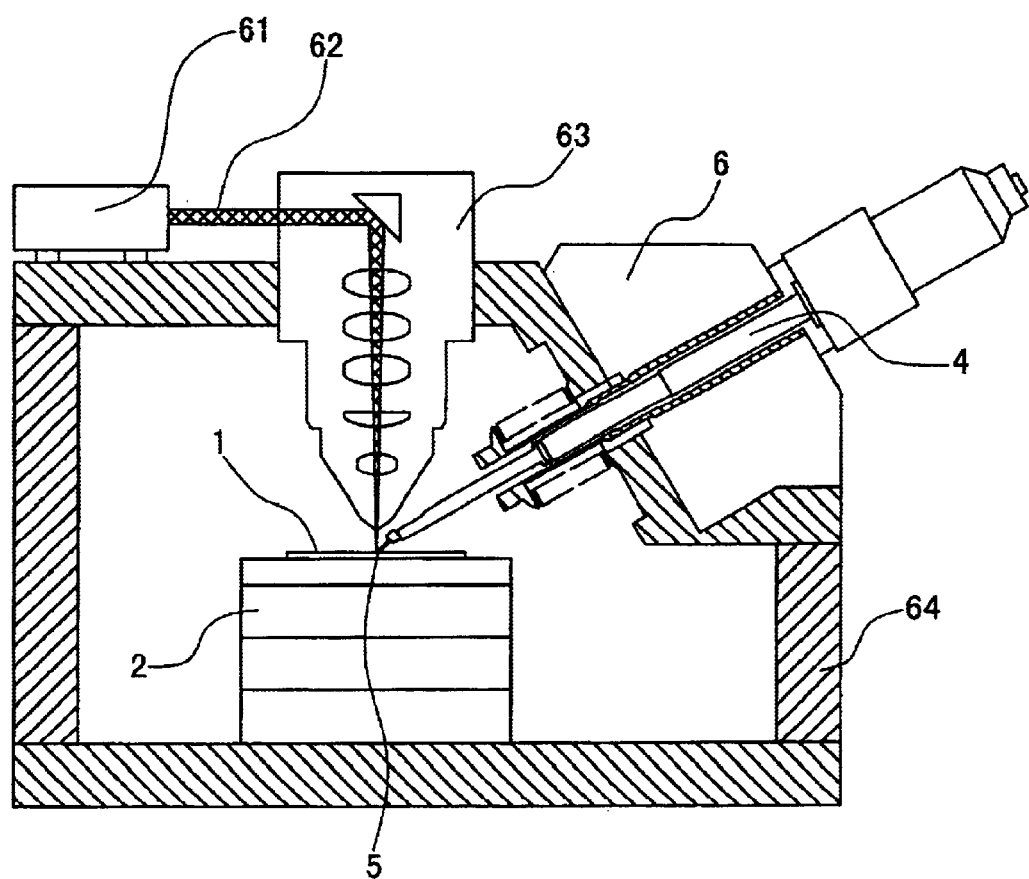
FIG. 20 is a schematic cross sectional view showing a basic configuration of a specimen fabrication equipment in accordance with a sixteenth example of the present invention.

In FIG. 20, a reference numeral 61 denotes a laser beam source for generating a laser beam 62 for laser beam processing to be used for separating and extracting the micro-sample 25 from the specimen substrate 1. The laser beam 62 generated from the laser beam source 61 is irradiated onto the specimen substrate 1 via a laser beam irradiating optical system 63 for condensing the laser beam 62, and irradiating it to a prescribed position. Further, in this example, the following configuration is adopted. Namely, a visible light beam emitted from a visible light source not shown is made incident coaxially with the laser beam 62 in the laser beam irradiating optical system 63. Thus, an image obtained by irradiation with the visible light beam is used for observation. However, an optical microscope or the like may also separately disposed for obtaining the image for observation. Further, a reference numeral 64 in the diagram denotes a chamber composed by mounting therein the laser beam irradiating optical system 63, the stage 2, the sample hold system 4, the transfer system 6 for transferring the sample hold system 4 in the X, Y, and Z directions, and the like.

By using the specimen fabrication (processing) equipment capable of separation and extraction of the micro-sample, with the foregoing configuration in accordance with this example, it is possible to obtain the following effects as compared with the specimen fabrication (processing) equipment shown in previous Example 1. First, by using a laser beam for separating and extracting the micro-sample 25 including the observation region from the specimen substrate 1 in place of the FIB, it becomes possible to fabricate the micro-sample 25 with a size of the order of several tens of micrometers to several hundreds of micrometers in a shorter time. Secondly, it becomes possible to use the various micro-sample separation and extraction methods (steps) and means for carrying out them shown in the foregoing various examples in the air.

EXAMPLE 17

A still more example of the present invention will be described.

In previous Example 1, a description has been given to the method for fabricating a micro-sample for TEM observation and the equipment therefor in accordance with the present invention. The operation of thinning the extracted micro-sample for fabrication of the micro-sample for TEM observation is accomplished by the following two methods: the method in which the operation is performed with the extracted micro-sample 25 held in a sandwiched manner by the beam 5 as shown in the step I (FIG. 4I) in previous Example 1; and the method in which the operation is performed with the extracted micro-sample 25 firmly held on the sample holder 41 as shown in the step M (FIG. 10M) in previous Example 4. Both of these methods have been already described in details.

This Example 17 pertains to a still other specimen fabrication method of the present invention different from previous Example 1 and Example 4. Particularly, it pertains to a method for completing the thinning processing of a desired portion of the micro-sample to be extracted within the specimen substrate, separating and extracting the micro-sample having the already thinned portion from the specimen substrate, and firmly holding the separated and extracted pre-thinned micro-sample on the sample holder, or fixing it on a grid for holding the micro-sample. Below, the specimen fabrication method in accordance with this example will be described by reference to a flow chart of steps shown in FIGS. 21A to 21L.

Step A (FIG. 21A): A region 152 to be observed by TEM is indicated by a dashed line at a part of a specimen substrate 151. The width of the observation region 152 (the length of the dashed line) is, for example, about 20 $\mu$m.

Step B (FIG. 21B): Prior to subjecting the observation region 152 to cutting processing by the FIB, a deposition film 153 is formed with an ion beam assisted deposition method in order to protect the surface of the specimen substrate 151 including the observation region 152. The typical example of the dimensions of this deposition film 153 is as follows: 3 µm in width, 1 µm in height, and 25 µm in length. The material therefor is carbon, tungsten, platinum, palladium, or the like.

Step C (FIG. 21C): An FIB 154 is irradiated along the long side of the deposition film 153 formed in the step B to form a trench 155. This trench 155 measures about 3 µm in width and about 15 µm in depth, and it is processed to a little longer length than the length of the deposition film 153 in the direction of length.

Step D (FIG. 21D): A large rectangular hole 156 having the shape as shown in the diagram is formed also on the opposite side of the deposition film 153. The opening of the large rectangular hole 156 is larger as compared with the trench 155, and the processed side 157 of the large rectangular hole 156 forms an inclined plane. Herein, the FIB is also irradiated to one longitudinal end side of the deposition film 153 so as to ensure a communication between the previously formed trench 155 and the large rectangular hole 156 formed in this step, thereby forming a side trench 158. With such a processing, formation of a minute micro-sample 159 with only its bottom and its other longitudinal end, side connected to the specimen substrate 151 is completed.

Step E (FIG. 21E): Then, the specimen substrate 151 is tilted. Thus, the bottom 160a of the micro-sample 159 and a part 160b of the other longitudinal end side connection part of the micro-sample 159 are cut and removed through irradiation with the FIB 154. This results in the micro-sample 159 with only a minute residual area 160c left.

Step F (FIG. 21F): At the stage where a micro-sample 161 being connected to the specimen substrate 151 only through its minute residual area 160c has been obtained in the step E, the irradiation of FIB, is stopped, and the specimen substrate 151 is returned to the horizontal state again. At this stage, the micro-sample 161 is being connected to and held by the specimen substrate 151 only through the minute support area (residual connection area) 160c.

Step G (FIG. 21G): Then, the FIB is scanned along the direction of length of the micro-sample 159, so that the opposite longitudinal ends 161a of the micro-sample 159 are left, and the other region 162 is subjected to thinning processing to a thickness of about 100 nm. This results in a thin region 162 having a thickness suitable for TEM observation. In other words, this thin region 162 is the region to be observed by TEM. An example of the dimensions of the thin region is 15 µm in width, 15 µm in height, and about 100 nm in thickness. The thick region 161a is left around the thin region 162. The thick region 161a can bear a role as a support for the micro-sample 159, and a role of reinforcing the thin region 162.

Step H (FIG. 21H): The thick region 161a left around the thin region 162 of the micro-sample 159 obtained in the foregoing step is sandwiched and held in a beam 164 having two branch beams 163 at its tip. Since the width of the thick region 161a is about several micrometers, the branch beams 163 for holding will not be in direct contact with the thin region 162 having a thickness of about 100 nm. There is no risk that the thin region 162 is broken by vibrations generated upon contact of the branch beams 163 with the thick region 161a, or during extraction and transfer of the micro-sample, and the like.

Step I (FIG. 21I): With the thick region 161a sandwiched by the beam 164, the residual area 160c is cut by irradiation with the FIB 154 to separate the micro-sample 159 from the specimen substrate 151.

Step J (FIG. 21J): The beam 164 is transferred away from the inside of a processed hole 166 of the specimen substrate 151 with the micro-sample 165 separated from the specimen substrate 151 in the foregoing step I held in a sandwiched manner therein. As a result, the micro-sample 165 including the thin region (the cross section to be observed by TEM) 162 is extracted from the specimen substrate 151.

Figure 21A:
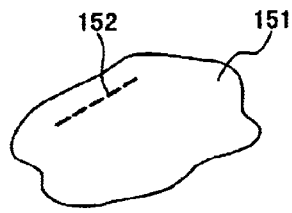
FIGS. 21A to 21L are a schematic flow chart of steps for illustrating a specimen fabrication process by using a specimen fabrication equipment in accordance with a seventeenth example of the present invention.
Figure 21E:
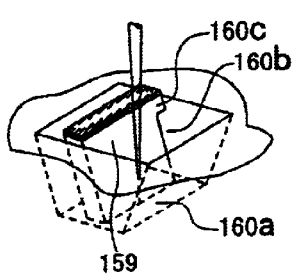
Figure 21I:
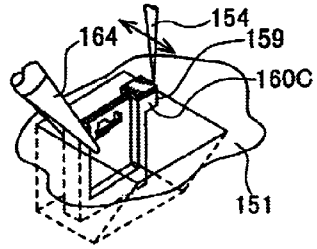
Figure 21B:
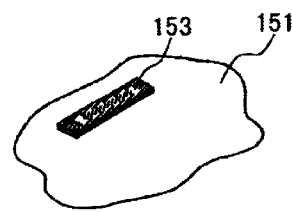
Figure 21F:
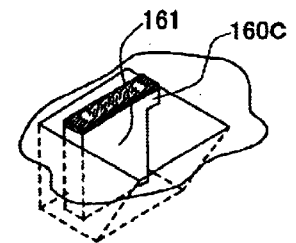
Figure 21J:
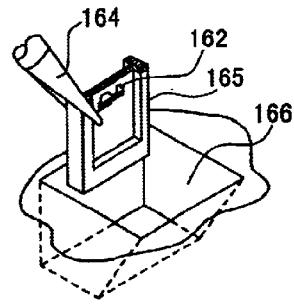
Figure 21C:
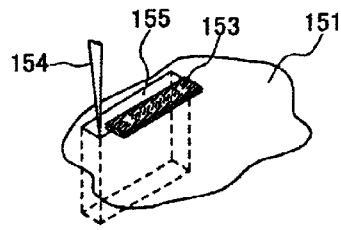
Figure 21G:
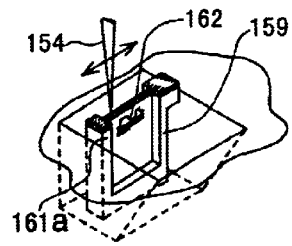
Figure 21K:
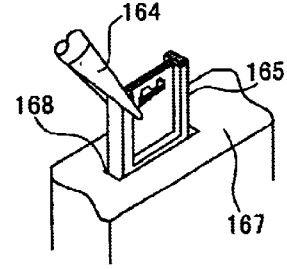
Figure 21D:
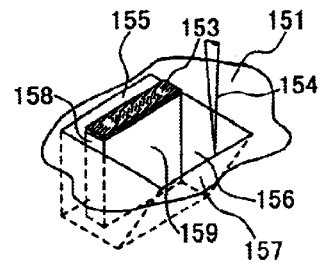
Figure 21H:
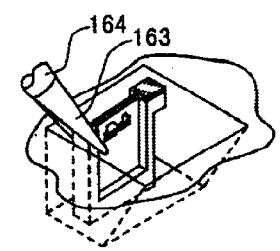
Figure 21L:
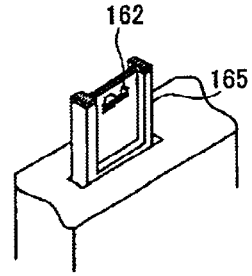

Step K (FIG. 21K): The micro-sample 165 in which the thin region 162 to be observed by TEM has been formed is mounted on a sample holder 167 for introducing the micro-sample 165 into the specimen chamber of a TEM apparatus. The mounting method therefor is accomplished in two manners. A first method thereof is the same method as shown in the step K (FIG. 10K) of previous Example 6, wherein by inserting the micro-sample 165 into a long vertical trench 168 previously disposed in the top of the sample holder 167 as shown in FIG. 21K, the micro-sample 165 is held in the long vertical trench 168.

Step L (FIG. 21L): After checking the state of insertion of the micro-sample 165 into the trench 168, the beam 164 is separated away from the micro-sample 165. This results in the micro-sample 165 being observable by TEM, mounted on the sample holder 167.

Figure 22A:
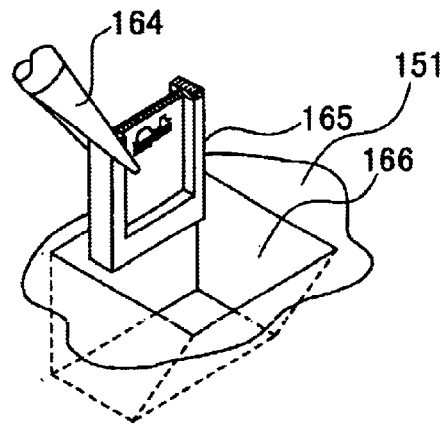
FIGS. 22A to 22C are a schematic flow chart of steps for illustrating another example of a method for firmly mounting an extracted micro-sample on a sample holder in the specimen fabrication process by using the specimen fabrication equipment in accordance with the seventeenth example of the present invention.
Figure 22B:
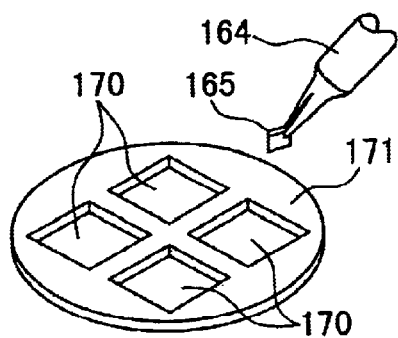
Figure 22C:
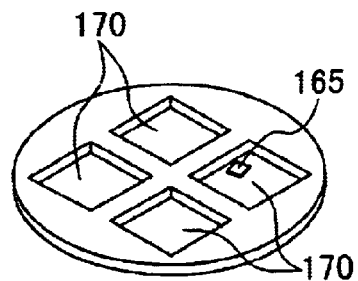

A second method out of the foregoing two methods for mounting the micro-sample 165 on the sample holder 167 will be described by reference to FIGS. 22A to 22C. Incidentally, also in the example herein shown, the steps until the micro-sample 165 is separated from the specimen substrate 151 are the same as the steps A to J in the previous first method. Herein, a description will be given to the step A (FIG. 22A) of extracting the micro-sample 165 from the top of the specimen substrate 151, and later steps.

Step A (FIG. 22A): With the micro-sample 165 to be extracted in the heretofore described steps A to J (illustrations by diagrams are omitted) held at the tip of the beam 164, the micro-sample 165 is separated away from the specimen substrate 151. Then, the beam 164 holding the micro-sample 165 is transferred in the direction away from the specimen substrate 151, so that the micro-sample 165 is extracted from the specimen substrate 151.

Step B (FIG. 22B): Thereafter, the separated and extracted micro-sample 165 is set on an opening 171 of a grid 170 formed with a thin wall thickness. At this step, a thin film made of a carbon-based material such as collodion is previously provided in a tensioned state in the opening 171. The grid 170 is installed and prepared in an apparatus in vacuum state. Thus, the separated and extracted micro-sample 165 is attached and set on the grid 170 so as to face the carbon-based thin film surface. When the micro-sample 165 is difficult to detach from the tip of the beam 164 upon attachment and setting of the micro-sample 165 onto the grid 170, it can be detached therefrom with ease by performing an operation of bringing the beam 164 in contact with a part of the grid, or the like.

Step C (FIG. 22C): The grid 170 with the micro-sample 165 attached and held thereon is then introduced in the TEM apparatus. Thus, the thin region of the micro-sample 165 is observed through the carbon-based thin film. At this step, the grid 170 is set so that the grid surface is perpendicular to an electron beam for observation in the TEM apparatus. The electron beam for observation can pass through the carbon-based thin film disposed on the grid for holding the micro-sample. Therefore, the presence of the carbon-based thin film will not adversely affect the TEM observation image at all. This allows a TEM observation of a desired micro-sample thin region at a high magnification.

The first micro-sample mounting method formerly described has an advantage in that additional FIB processing can be performed on the micro-sample mounted on the sample holder. Whereas, the second micro-sample mounting method latterly described has a restriction that additional processing cannot be performed on the micro-sample once attached on the carbon-based thin film, but has an advantage in that a commercially available cheap grid can be used.

By adopting the method for separating and extracting the micro-sample by using the beam having the branch beams at its tip, and the method for mounting the micro-sample on the sample holder or the grid for TEM observation, shown in this Example 17 described above, the following excellent effects can be obtained. (1) There is no risk of contaminating the thin region to be observed on the micro-sample by supply of an assist gas for forming a deposition film as in the case of methods for separating and extracting, and mounting the micro-sample applying a prior-art deposition film formation technology. In consequence, a clear image can be obtained; (2) Since the separated and extracted micro-sample can be mounted on the sample holder or the grid with ease, it is possible to complete the operation of fabricating the specimen for TEM observation in a shorter time, and hence to improve the specimen fabrication efficiency; (3) As compared with the specimen fabrication method shown in Example 1, all the steps until the completion of the operation of forming the thin region for TEM observation can be performed by FIB processing within the specimen substrate. Therefore, it is easy to fabricate a large number of thinned specimens in a shorter time and without human intervention by automatic processing with the FIB; (4) Since commercially available products can be used as the grids, it is possible to fabricate the specimen for TEM observation cheaply; and the like.

With a prior-art method for holding a micro-sample by attracting it to the tip of a glass rod through the electrostatic force, unfavorably, the charging state becomes unstable due to the moisture in the air, so that the micro-sample is unstably held. Similarly, even if the glass rod is brought into a vacuum apparatus, and an attempt is made to charge the glass rod for attracting and holding the micro-sample thereto, unfavorably, the probability that good micro-sample holding can be carried out is low because of the difficulty of control of the charging state. In contrast, with the method for holding the micro-sample through a physical force, such as the method for holding the micro-sample in a sandwiched manner by using the beam in accordance with the examples of the present invention, the foregoing problems will not occur. Further, it becomes possible to select the attachment position and the transfer path of the micro-sample irrespective of the electric potential distribution in the vacuum chamber.

Further, with the method for separating and extracting the micro-sample in accordance with the examples of the present invention, without using an attraction and holding method through a low reliability electrostatic force for holding the thinned specimen, the following operations are possible. Namely, the micro-sample is held by the sandwiching and holding method by the beam, and separated and extracted from the specimen substrate. Then, it is transferred onto a prescribed sample holder, and firmly mounted thereon with reliability. These points are basically different from the prior-art technology. In accordance with the foregoing examples of the present invention, without causing the valuable thinned specimen to shatter by a repulsive force due to the static electricity, and without causing the thinned specimen to drop due to the reduction in electrostatic force, it is possible to separate and extract the thinned specimen with reliability, transfer it to a desired position, and to firmly mount it thereon. Further, all the steps from the fabrication of the thinned specimen through the completion of the fabrication of the specimen for TEM observation by firmly mounting it on the sample holder or the grid, and the like are carried out in vacuum (in an apparatus). As a result, the steps will not be affected by the environmental conditions such as the moisture in the air (in the laboratory).

Still further, with the method for holding a micro-sample by attracting it to the tip of a glass rod through the electrostatic force, unfavorably, the charging state becomes unstable due to the moisture in the air. Similarly, even if the glass rod is brought into a vacuum apparatus, and an attempt is made to charge the glass rod for attracting the micro-sample thereto, eventually, the probability that the intended purpose can be achieved is low because of the difficulty of control of charging. In contrast, with the method for holding the micro-sample through a physical force as with the examples of the present invention, the foregoing problems will not basically occur. Further, it becomes possible to select the attachment position of the system or apparatus for implementing separation and extraction, and transfer and mounting of the micro-sample, and further the transfer path (transfer passage) for the micro-sample irrespective of the electric potential distribution in the vacuum chamber, and the like.

Up to this point, a description has been given to the examples in accordance with the gist of the present invention by reference to the drawings. However, the foregoing examples should not be construed as limiting the scope of the present invention. It is needless to say that other various modified examples can be used without departing from the gist of the present invention.

As apparent from the foregoing detailed description on the present invention by way of various examples, with the specimen fabrication (processing) method in accordance with the present invention, as compared with the prior-art technology, it is possible to reduce the contamination inflicted on the minute micro-sample to be separated and extracted from the top of the specimen substrate and the region in the vicinity of its periphery. In addition, it is possible to separate and extract the minute micro-sample from the top of the specimen substrate, and to store it with stability. Further, it is possible to shorten the processing time required therefor to about ½ the prior-art processing time. Therefore, it is possible to fabricate a specimen for high reliability observation, analysis, measurement, and the like efficiently with reliability and stability.

What is claimed is:

1. An electrically conductive beam used for separating and extracting a minute micro-sample from a specimen substrate in vacuum space, said beam comprising:

a plurality of branch beams having electric conductivity at a tip of said beam;

wherein said branch beams are separated from each other by a distance which is smaller than a thickness of a minute micro-sample to be held between said branch beams when said beam is moved in the direction of the minute micro-sample, and said branch beams being forcibly spread by the minute micro-sample so that the minute micro-sample is held by a resiliency force of said branch beams.

2. An electrically conductive beam according to claim 1:
wherein said sample holder and said beam are moveable relative to one another so that the minute micro-sample held between said branch beams is removeable from said branch beams by being trapped by a part of said sample holder.

3. An equipment for specimen fabrication, comprising:
a stage for mounting a specimen thereon;
a microscope for monitoring a position where a minute micro-sample is to be cut out from the specimen and for monitoring operations of cutout of the minute micro-sample from the specimen;
a sample hold system having an electrically conductive beam, at a top of which a plurality of branch beams having an electric conductivity are formed; and
a control system for controlling the position and rotation of said beam;
wherein said branch beams are separated from each other by a distance which is smaller than a thickness of the minute micro-sample to be held between said branch beams when said beam is moved in the direction of the minute micro-sample, and said branch beams being forcibly spread by the minute micro-sample so that the minute micro-sample is held by a resiliency force of said branch beams.

4. An equipment for specimen fabrication, comprising:
a stage for mounting a specimen thereon;
a microscope for monitoring a position where a minute micro-sample is to be cut out from the specimen and for monitoring operations of cutout of the minute micro-sample from the specimen;
a sample hold system having an electrically conductive beam, at a top of which a plurality of branch beams having an electric conductivity are formed;
a detector for detecting that the top of said branch beams has come into contact with the minute micro-sample which is cut out from the specimen; and
a driver for moving the beam in the direction of the stage in a predetermined amount based on the signal from the detector according to the detection of contact of the top of said branch beams and the minute micro-sample;
wherein said branch beams are separated from each other by a distance which is smaller than a thickness of the minute micro-sample to be held between said branch beams when said beam is moved in the direction of the minute micro-samples and said branch beams being forcibly spread by the mnute micro-sample so that the minute micro-sample is held by a resiliency force of said branch beams.

5. The equipment for specimen fabrication according to claim 3:
wherein said microscope is at least one of an optical microscope, a scanning electron microscope, and a scanning ion microscope.

6. A method for specimen fabrication, comprising:
mounting a specimen on a stage;
cutting a minute micro-sample from said specimen;
contacting a top of electric conductivity branch beams which are formed at a top of an electrically conductive beam to a part of the minute micro-sample cutout from the specimen;
detecting that the top of said branch beams has come into contact with the minute micro-sample;
moving the beam in the direction of the stage in a predetermined amount after detection of contact of the top of said branch beams and the minute micro-sample; and
moving the beam in the reverse direction to the stage after the minute micro-sample is held by a resiliency force of said branch beams;
wherein said branch beams are separated from each other by a distance which is smaller than a thickness of the minute micro-sample to be held between said branch beams when said beam is moved in the direction of the minute micro-sample and said branch beams being forcibly spread by the minute micro-sample so that the minute micro-sample is held by the resiliency force of said branch beams.

7. The method for specimen fabrication according to claim 6, comprising:
moving said sample holder and said beam relative to one another so that the minute micro-sample held between said branch beams is removed from said branch beams by being trapped by a part of said sample holder, so as to transfer the minute micro-sample to the sample holder.

8. A method for specimen fabrication, comprising:
mounting a specimen substrate on a stage;
cuffing a minute micro-sample from said specimen substrate;
holding the minute micro-sample at the top of electric conductivity branch beams which are formed at a top of an electrically conductive beam;
extracting the minute micro-sample held by a restoring force of said branch beams from the specimen substrate;
processing an extracted minute micro-sample by an irradiation with a charged beam; and
storing a processed minute micro-sample on a mounting holder on the stage.

9. The equipment for specimen fabrication according to claim 4:
wherein said microscope is at least one of an optical microscope, a scanning electron microscope, and a scanning ion microscope.

10. An electrically conductive beam according to claim 1:
wherein said plurality of branch beams are formed at a tip of said beam by cutting the tip of said beam so that a deep cut is formed between said plurality of branch beams.

11. An electrically conductive beam according to claim 1:
wherein said beam is held by a metal beam which has a diameter larger than that of said beam, and said metal beam is held by a detachable holder which has a diameter larger than that of said metal beam, so that said beam can be held to or removed from said detachable holder.

12. An electrically conductive beam according to claim 2:
wherein said plurality of branch beams are formed at a tip of said beam by cutting the tip of said beam so that a deep cut is formed between said plurality of branch beams.

13. An electrically conductive beam according to claim 2:
wherein said beam is held by a metal beam which has a diameter larger than that of said beam, and said metal beam is held by a detachable holder which has a diameter larger than that of said metal beam, so that said beam can be held to or removed from said detachable holder.

14. An electrically conductive beam according to claim 1:
wherein said plurality of branch beams are formed at a tip of said beam by cutting the tip of said beam so that two deep cuts are formed crossed With each other between said plurality of branch beams, and each width of said two deep cuts are different.

15. An electrically conductive beam according to claim 2:

wherein said plurality of branch beams are formed at a tip of said beam by cutting the tip of said beam so that two deep cuts are formed crossed with each other between said plurality of branch beams, and each width of said two deep cuts are different.

16. An electrically conductive beam according to claim 10:

wherein the thickness of said minute micro-sample is taken Into account in real-time in setting a width of said deep cuts so that said branch beams are separated from each other by the distance which is smaller than the thickness of said minute micro-sample.

17. An electrically conductive beam according to claim 12:

wherein the thickness of said minute micro-sample is taken into account in real-time in setting a width of said deep cut, so that said branch beams are separated from each other by the distance which is smaller than the thickness of said minute micro-sample.

18. An electrically conductive beam according to claim 14:

wherein the thickness of said minute micro-sample is taken into account in real-time in setting a width of at least one deep cut of said two deep cuts, so that said branch beams are separated from each other by the distance which is smaller than the thickness of said minute micro-sample.

19. An electrically conductive beam according to claim 15:

wherein the thickness of said minute micro-sample is taken into account in real-time in setting a width of at least one deep cut of said two deep cuts, so that said branch beams are separated from each other by the distance which is smaller than the thickness of said minute micro-sample.

* * * * *